(12) United States Patent
Grube et al.

(10) Patent No.: US 9,311,185 B2
(45) Date of Patent: Apr. 12, 2016

(54) DISPERSED STORAGE UNIT SOLICITATION METHOD AND APPARATUS

(71) Applicant: CLEVERSAFE, INC., Chicago, IL (US)

(72) Inventors: Gary W. Grube, Barrington Hills, IL (US); Timothy W. Markison, Mesa, AZ (US)

(73) Assignee: CLEVERSAFE, INC., Chicago, IL (US)

( * ) Notice: Subject to any disclaimer, the term of this patent is extended or adjusted under 35 U.S.C. 154(b) by 110 days.

(21) Appl. No.: 14/294,131

(22) Filed: Jun. 2, 2014

(65) Prior Publication Data

US 2014/0281817 A1 Sep. 18, 2014

Related U.S. Application Data

(63) Continuation-in-part of application No. 12/850,606, filed on Aug. 4, 2010.

(60) Provisional application No. 61/256,314, filed on Oct. 30, 2009.

(51) Int. Cl.
| | |
|---|---|
| *G06F 11/00* | (2006.01) |
| *G06F 11/10* | (2006.01) |
| *G06F 13/16* | (2006.01) |

(Continued)

(52) U.S. Cl.
CPC ........ *G06F 11/1076* (2013.01); *G06F 13/1668* (2013.01); *H04L 41/5054* (2013.01); *G06F 2211/1028* (2013.01); *H03M 13/09* (2013.01); *H03M 13/15* (2013.01); *H03M 13/1515* (2013.01); *H03M 13/23* (2013.01); *H04L 41/06* (2013.01); *H04L 67/1097* (2013.01)

(58) Field of Classification Search
CPC ............ G06F 11/1076; G06F 13/1668; G06F 2211/1028; H04L 41/5054; H04L 67/1097
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Philip Guyton
(74) *Attorney, Agent, or Firm* — Garlick & Markison; Timothy W. Markison

(57) ABSTRACT

A method begins by one or more computing devices obtaining data for storage in a storage as service network environment. The method continues by determining storage preferences regarding the data. The method continues by determining a set of storage units based on the storage preferences and sending a solicitation request to the set of storage units. When at least a minimum number of favorable solicitation responses have been received within a time period, the method continues by determining a dispersed storage error encoding function based on the favorable solicitation responses, the storage preferences, and available encoding schemes. The method continues by encoding the data based on the selected dispersed storage error encoding function to produce a plurality of sets of encoded data slices. The method continues by outputting the sets of encoded data slices to at least some of the storage units providing the favorable solicitation responses.

27 Claims, 16 Drawing Sheets

(51) Int. Cl.

| | |
|---|---|
| H04L 29/08 | (2006.01) |
| H03M 13/09 | (2006.01) |
| H03M 13/15 | (2006.01) |
| H03M 13/23 | (2006.01) |
| H04L 12/24 | (2006.01) |

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 7,801,994 | B2 * | 9/2010 | Kudo ............ 709/226 |
| 7,945,640 | B1 * | 5/2011 | VanTine ............ 709/217 |
| 8,099,394 | B2 * | 1/2012 | Malcolm ............ 707/661 |
| 8,281,023 | B2 * | 10/2012 | Dondeti et al. ............ 709/229 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0061491 | A1 * | 3/2003 | Jaskiewicz et al. ............ 713/182 |
| 2003/0065617 | A1 | 4/2003 | Watkins et al. |
| 2003/0084020 | A1 | 5/2003 | Shu |
| 2003/0177261 | A1 * | 9/2003 | Sekiguchi et al. ............ 709/238 |
| 2004/0024963 | A1 | 2/2004 | Talagala et al. |
| 2004/0122917 | A1 | 6/2004 | Menon et al. |
| 2004/0199566 | A1 * | 10/2004 | Carlson et al. ............ 709/201 |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0036820 | A1 * | 2/2006 | Ejiri et al. ............ 711/158 |
| 2006/0047907 | A1 | 3/2006 | Shiga et al. |
| 2006/0117046 | A1 * | 6/2006 | Robertson et al. ............ 707/101 |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2011/0055161 | A1 * | 3/2011 | Wolfe ............ 707/652 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner routing table 266

| from | to | route ID | route priority | route | | | | |
|---|---|---|---|---|---|---|---|---|
| DSPU | DS Unit 1 | 1 | 2 | DSPU | R2 | R3 | R4 | DSU 1 |
| | | 2 | 2 | DSPU | R2 | R5 | R4 | DSU 1 |
| | | 3 | 1 | DSPU | R1 | R4 | DSU 1 | |
| DSPU | DS Unit 2 | 1 | 3 | DSPU | R2 | R3 | R4 | R5 | DSU 2 |
| | | 2 | 4 | DSPU | R1 | R4 | R3 | R2 | DSU 2 |
| | | 3 | 1 | DSPU | R2 | R5 | DSU 2 | | |
| | | 4 | 2 | DSPU | R1 | R4 | R5 | DSU 2 | |

FIG. 18

DISPERSED STORAGE UNIT SOLICITATION METHOD AND APPARATUS

CROSS REFERENCE TO RELATED PATENTS

The present U.S. Utility patent application claims priority pursuant to 35 U.S.C. §120 as a continuation-in-part of U.S. Utility application Ser. No. 12/850,606, entitled "DISPERSED STORAGE UNIT SOLICITATION METHOD AND APPARATUS", filed Aug. 4, 2010, which claims priority pursuant to 35 U.S.C. §119(e) to U.S. Provisional Application No. 61/256,314, entitled "AUTONOMOUS DISTRIBUTED STORAGE NETWORK", filed Oct. 30, 2009, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to computing and more particularly to storage of information.

2. Description of Related Art

Computing systems are known to communicate, process, and store data. Such computing systems range from wireless smart phones to data centers that support millions of web searches, stock trades, or on-line purchases every day. Computing processing is known to manipulate data from one form into another. For instance, raw picture data from an image sensor may be compressed, or manipulated, in accordance with a picture compression standard to produce a standardized compressed picture that can be saved or shared with others. Computer processing capability continues to advance as processing speed advances and software applications that perform the manipulation become more sophisticated.

With the advances in computing processing speed and communication speed, computers manipulate real time media from voice to streaming high definition video. Purpose-built communications devices, like the phone, are being replaced by more general-purpose information appliances. For example, smart phones can support telephony communications but they are also capable of text messaging, and accessing the internet to perform functions including email, web browsing, remote applications access, and media communications. Media communications includes telephony voice, image transfer, music files, video files, real time video streaming and more.

Each type of computing system is constructed, and hence operates, in accordance with one or more communication, processing, and storage standards. With such standards, and with advances in technology, more and more of the global information content is being converted into electronic formats. For example, more digital cameras are now being sold than film cameras, thus producing more digital pictures. High growth rates exist for web based programming that until recently was all broadcast by just a few over the air television stations and cable television providers. Digital content standards, such as used in pictures, papers, books, video entertainment, home video, all enable this global transformation to a digital format. Electronic content pervasiveness is producing increasing demands on the storage function of computing systems.

A typical computer storage function includes one or more memory devices to match the needs of the various operational aspects of the processing and communication functions. For example, a memory device may include solid-state NAND flash, random access memory (RAM), read only memory (ROM), a mechanical hard disk drive. Each type of memory device has a particular performance range and normalized cost. The computing system architecture optimizes the use of one or more types of memory devices to achieve the desired functional and performance goals of the computing system. Generally, the immediacy of access dictates what type of memory device is used. For example, RAM memory can be accessed in any random order with a constant response time. By contrast, memory device technologies that require physical movement such as magnetic discs, tapes, and optical discs, have a variable response time as the physical movement can take longer than the data transfer.

Each type of computer storage system is constructed, and hence operates, in accordance with one or more storage standards. For instance, computer storage systems may operate in accordance with one or more standards including, but not limited to network file system (NFS), flash file system (FFS), disk file system (DFS), small computer system interface (SCSI), internet small computer system interface (iSCSI), file transfer protocol (FTP), and web-based distributed authoring and versioning (WebDAV). An operating systems (OS) and storage standard may specify the data storage format and interface between the processing subsystem and the memory devices. The interface may specify a structure such as directories and files. Typically a memory controller provides an interface function between the processing function and memory devices. As new storage systems are developed, the memory controller functional requirements may change to adapt to new standards.

Memory devices may fail, especially those that utilize technologies that require physical movement like a disc drive. For example, it is not uncommon for a disc drive to suffer from bit level corruption on a regular basis, or complete drive failure after an average of three years of use. One common solution is to utilize more costly disc drives that have higher quality internal components. Another solution is to utilize multiple levels of redundant disc drives to abate these issues by replicating the data into two or more copies. One such redundant drive approach is called redundant array of independent discs (RAID). Multiple physical discs comprise an array where parity data is added to the original data before storing across the array. The parity is calculated such that the failure of one or more discs will not result in the loss of the original data. The original data can be reconstructed from the other discs. RAID 5 uses three or more discs to protect data from the failure of any one disc. The parity and redundancy overhead reduces the capacity of what three independent discs can store by one third (n−1=3−2=2 discs of capacity using 3 discs). RAID 6 can recover from a loss of two discs and requires a minimum of four discs with an efficiency of n−2. Typical RAID systems utilize a RAID control to encode and decode the data across the array.

Drawbacks of the RAID approach include effectiveness, efficiency and security. As more discs are added, the probability of one or two discs failing rises and is not negligible, especially if more desired less costly discs are used. When one disc fails, it should be immediately replaced and the data reconstructed before a second drive fails. To provide high reliability over a long time period, and if the RAID array is part of a national level computing system with occasional site outages, it is also common to mirror RAID arrays at different physical locations. Unauthorized file access becomes a more acute problem when whole copies of the same file are replicated, either on just one storage system site or at two or more sites. In light of the effectiveness, the efficiency of dedicating 1 to 2 discs per array for the RAID overhead is an issue.

Therefore, a need exists to provide a data storage solution that provides more effective timeless continuity of data, minimizes adverse affects of multiple memory elements failures, provides improved security, can be adapted to a wide variety storage system standards and is compatible with computing and communications systems.

BRIEF DESCRIPTION OF THE SEVERAL VIEWS OF THE DRAWING(S)

FIG. 18 is an example table representing a routing table in accordance with the invention;

DETAILED DESCRIPTION OF THE INVENTION

Figure 1:
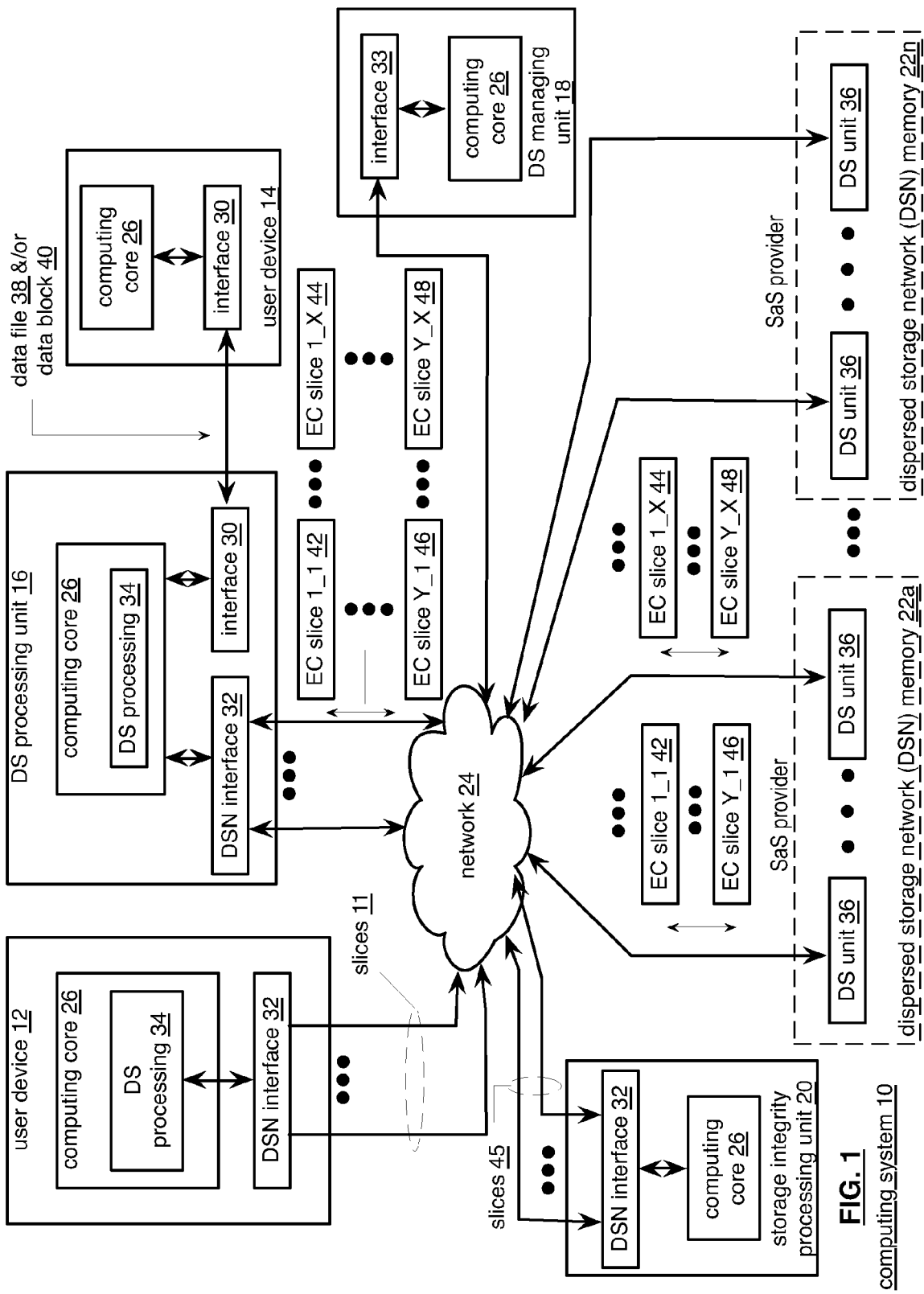
FIG. 1 is a schematic block diagram of an embodiment of a computing system in accordance with the invention.

FIG. 1 is a schematic block diagram of a computing system 10 in a storage as service network environment that includes one or more of a first type of user devices 12, one or more of a second type of user devices 14, at least one distributed storage (DS) processing unit 16, at least one DS managing unit 18, at least one storage integrity processing unit 20, and multiple distributed storage network (DSN) memories 22a-n operated by one or more storage as service (SaS) providers coupled via a network 24. The network 24 may include one or more wireless and/or wire lined communication systems; one or more private intranet systems and/or public internet systems; and/or one or more local area networks (LAN) and/or wide area networks (WAN).

Each of the DSN memories 22a-n are operated by a SaS provider. The same SaS provider may operate all DSN memories 22a-n, different SaS providers may operate each of the DSN memories 22a-n, or different SaS providers may operate some of the DSN memories 22a-n. For example, a SaS provider (e.g. SaS provider 1) may operate DSN memory 22a through DSN memory 22n. In another example, DSN memory 22a may be operated by a SaS provider (e.g. SaS provider 1), DSN memory 22b may be operated by another SaS provider (e.g. SaS provider 2), DSN memory 22c may be operated by another SaS provider (e.g. SaS provider 3), and so on. In another example, a SaS provider (e.g. SaS provider 1) may operate DSN memory 22a while another SaS provider (e.g. SaS provider 2) may operate DSN memories 22b-n.

Each of the DSN memories 22a-n includes a plurality of distributed storage (DS) units 36 for storing data of the system. Each of the DS units 36 includes a processing module and memory and may be located at a geographically different site than the other DS units (e.g., one in Chicago, one in Milwaukee, etc.). The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that if the processing module includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module executes, hard coded and/or operational instructions corresponding to at least some of the steps and/or functions illustrated in FIGS. 1-21.

Each of the user devices 12-14, the DS processing unit 16, the DS managing unit 18, and the storage integrity processing unit 20 may be a portable computing device (e.g., a camcorder, a social networking device, a gaming device, a cell phone, a smart phone, a personal digital assistant, a digital music player, a digital video player, a laptop computer, a handheld computer, a video game controller, and/or any other portable device that includes a computing core) and/or a fixed computing device (e.g., a personal computer, a computer server, a cable set-top box, a satellite receiver, a television set, a printer, a fax machine, home entertainment equipment, a video game console, and/or any type of home or office computing equipment). Such a portable or fixed computing device includes a computing core 26 and one or more interfaces 30, 32, and/or 33. An embodiment of the computing core 26 will be described with reference to FIG. 2.

With respect to the interfaces, each of the interfaces 30, 32, and 33 includes software and/or hardware to support one or more communication links via the network 24 and/or directly. For example, interface 30 supports a communication link (wired, wireless, direct, via a LAN, via the network 24, etc.) between the first type of user device 14 and the DS processing unit 16. As another example, DSN interface 32 supports a plurality of communication links via the network 24 between the DSN memories 22a-n and the DS processing unit 16, the first type of user device 12, and/or the storage integrity processing unit 20. As yet another example, interface 33 supports a communication link between the DS managing unit 18 and any one of the other devices and/or units 12, 14, 16, 20, and/or 22a-n via the network 24.

In general, the system 10 supports three primary functions: distributed network data storage management, distributed data storage and retrieval, and data storage integrity verification. In accordance with these three primary functions, data can be distributedly stored in a plurality of physically different locations and subsequently retrieved in a reliable and secure manner regardless of failures of individual storage devices, failures of network equipment, the duration of storage, the amount of data being stored, attempts at hacking the data, etc.

The DS managing unit 18 performs the distributed network data storage management functions, which include establishing distributed data storage parameters, performing network operations, performing network administration, and/or performing network maintenance. The DS managing unit 18 establishes the distributed data storage parameters (e.g., allocation of virtual DSN memory space, distributed storage parameters, security parameters, billing information, user profile information, etc.) for one or more of the user devices 12-14 (e.g., established for individual devices, established for a user group of devices, established for public access by the user devices, etc.). For example, the DS managing unit 18 coordinates the creation of a vault (e.g., a virtual memory block) within the DSN memory 22 for a user device (for a group of devices, or for public access). The DS managing unit 18 also determines the distributed data storage parameters for the vault. In particular, the DS managing unit 18 determines a number of slices (e.g., the number that a data segment of a data file and/or data block is partitioned into for distributed storage) and a threshold value (e.g., the minimum number of slices required to reconstruct the data segment).

As another example, the DS managing module 18 may create and store locally or within the DSN memories 22a-n user profile information. The user profile information includes one or more of authentication information, permissions, and/or the security parameters. The security parameters may include one or more of encryption/decryption scheme, one or more encryption keys, key generation scheme, and data encoding/decoding scheme.

As yet another example, the DS managing unit 18 may create billing information for a particular user, user group, vault access, public vault access, etc. For instance, the DS managing unit 18 may track the number of times a user accesses a private vault and/or public vaults, which can be used to generate a per-access bill. In another instance, the DS managing unit 18 tracks the amount of data stored and/or retrieved by a user device and/or a user group, which can be used to generate a per-data-amount bill.

The DS managing unit 18 also performs network operations, network administration, and/or network maintenance. As at least part of performing the network operations and/or administration, the DS managing unit 18 monitors performance of the devices and/or units of the system 10 for potential failures, determines the devices' and/or units' activation status, determines the devices' and/or units' loading, and any other system level operation that affects the performance level of the system 10. For example, the DS managing unit 18 may receive and aggregate network management alarms, alerts, errors, status information, performance information, and messages from the devices 12-14 and/or the units 16, 20, 22. For example, the DS managing unit 18 may receive a simple network management protocol (SNMP) message regarding the status of the DS processing unit 16.

The DS managing unit 18 performs the network maintenance by identifying equipment within the system 10 that needs replacing, upgrading, repairing, and/or expanding. For example, the DS managing unit 18 may determine that the DSN memory 22 needs more DS units 36 or that one or more of the DS units 36 needs updating.

The second primary function of distributed data storage and retrieval function begins and ends with a user device 12-14. For instance, if a second type of user device 14 has a data file 38 and/or data block 40 to store in the DSN memories 22a-n, it sends the data file 38 and/or data block 40 to the DS processing unit 16 via its interface 30. Note that the data file 38 and/or data block 40 may include a stream (e.g., media data, streaming media). As will be described in greater detail with reference to FIG. 2, the interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data file 38 and/or data block 40.

The DS processing unit 16 receives the data file 38 and/or data block 40 via its interface 30 and performs a distributed storage (DS) process 34 thereon. The DS processing 34 begins by partitioning the data file 38 and/or data block 40 into one or more data segments, which is represented as Y data segments. For example, the DS processing 34 may partition the data file 38 and/or data block 40 into a fixed byte size segment (e.g., $2^1$ to $2^n$ bytes, where n=>2) or a variable byte size (e.g., change byte size from segment to segment, or from groups of segments to groups of segments, etc.).

For each of the Y data segments, the DS processing 34 error encodes (e.g., forward error correction (FEC), information dispersal algorithm, or error correction coding) and slices (or slices then error encodes) the data segment into a plurality of error coded (EC) data slices 42-48, which is represented as X slices per data segment. The number of slices (X) per segment, which corresponds to a number of pillars n, is set in accordance with the distributed data storage parameters and the error coding scheme. For example, if a Reed-Solomon (or other FEC scheme) is used in an n/k system, then a data segment is divided into n slices, where k number of slices is needed to reconstruct the original data (i.e., k is the threshold). As a few specific examples, the n/k factor may be 5/3; 6/4; 8/6; 8/5; 16/10.

For each EC slice 42-48, the DS processing unit 16 creates a unique slice name and appends it to the corresponding EC slice 42-48. The slice name includes universal DSN memory addressing routing information (e.g., virtual memory addresses in the DSN memory 22) and user-specific information (e.g., user ID, file name, data block identifier, etc.).

The DS processing unit 16 transmits the plurality of EC slices 42-48 to a plurality of DS units 36 of the DSN memories 22*a-n* via the DSN interface 32 and the network 24. The DSN interface 32 formats each of the slices for transmission via the network 24. For example, the DSN interface 32 may utilize an internet protocol (e.g., TCP/IP, etc.) to packetize the EC slices 42-48 for transmission via the network 24.

The number of DS units 36 receiving the EC slices 42-48 is dependent on the distributed data storage parameters established by the DS managing unit 18. For example, the DS managing unit 18 may indicate that each slice is to be stored in a different DS unit 36 in the same DSN memory 22*a-n*. As another example, the DS managing unit 18 may indicate that each slice is to be stored in a different DS unit 36 in a different DSN memory 22*a-n*. As another example, the DS managing unit 18 may indicate that like slice numbers of different data segments are to be stored in the same DS unit 36 in the same or different DSN memory 22*a-n*. For example, the first slice of each of the data segments is to be stored in a first DS unit 36, the second slice of each of the data segments is to be stored in a second DS unit 36, etc. In this manner, the data is encoded and distributedly stored at physically diverse locations to improve data storage integrity and security. Further examples of encoding the data segments will be provided with reference to one or more of FIGS. 2-21.

Each DS unit 36 that receives an EC slice 42-48 for storage translates the virtual DSN memory address of the slice into a local physical address for storage. Accordingly, each DS unit 36 maintains a virtual DSN address to physical location memory mapping to assist in the storage and retrieval of data.

The first type of user device 12 performs a similar function to store data in the DSN memories 22*a-n* with the exception that it includes the DS processing. As such, the device 12 encodes and slices the data file and/or data block it has to store. The device then transmits the slices 11 to the DSN memories 22*a-n* via its DSN interface 32 and the network 24.

For a second type of user device 14 to retrieve a data file or data block from memory, it issues a read command via its interface 30 to the DS processing unit 16. The DS processing unit 16 performs the DS processing 34 to identify the DS units 36 storing the slices of the data file and/or data block based on the read command. The DS processing unit 16 may also communicate with the DS managing unit 18 to verify that the user device 14 is authorized to access the requested data.

Assuming that the user device is authorized to access the requested data, the DS processing unit 16 issues slice read commands to at least a threshold number of the DS units 36 storing the requested data (e.g., to at least 10 DS units for a 16/10 error coding scheme). Each of the DS units 36 receiving the slice read command, verifies the command, accesses its virtual to physical memory mapping, retrieves the requested slice, or slices, and transmits it to the DS processing unit 16.

Once the DS processing unit 16 has received a threshold number of slices for a data segment, it performs an error decoding function and de-slicing to reconstruct the data segment. When Y number of data segments has been reconstructed, the DS processing unit 16 provides the data file 38 and/or data block 40 to the user device 14. Note that the first type of user device 12 performs a similar process to retrieve a data file and/or data block.

The storage integrity processing unit 20 performs the third primary function of data storage integrity verification. In general, the storage integrity processing unit 20 periodically retrieves slices 45 of a data file or data block of a user device to verify that one or more slices has not been corrupted or lost (e.g., the DS unit failed). The retrieval process mimics the read process previously described.

If the storage integrity processing unit 20 determines that one or more slices is corrupted or lost, it rebuilds the corrupted or lost slice(s) in accordance with the error coding scheme. The storage integrity processing unit 20 stores the rebuilt slice, or slices, in the appropriate DS unit(s) 36 in a manner that mimics the write process previously described.

Figure 2:
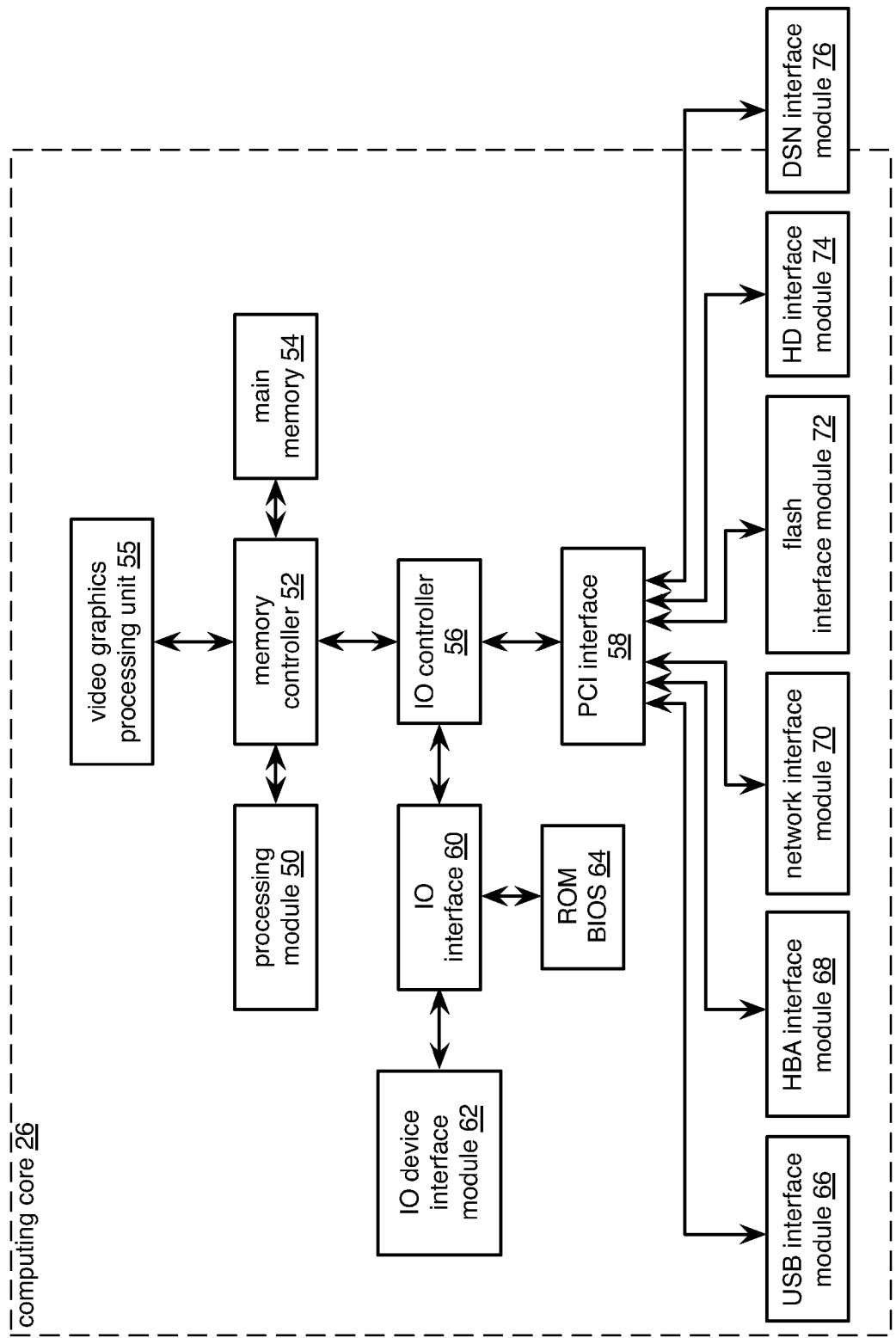
FIG. 2 is a schematic block diagram of an embodiment of a computing core in accordance with the invention.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface 60, at least one IO device interface module 62, a read only memory (ROM) basic input output system (BIOS) 64, and one or more memory interface modules. The memory interface module(s) includes one or more of a universal serial bus (USB) interface module 66, a host bus adapter (HBA) interface module 68, a network interface module 70, a flash interface module 72, a hard drive interface module 74, and a DSN interface module 76. Note the DSN interface module 76 and/or the network interface module 70 may function as the interface 30 of the user device 14 of FIG. 1. Further note that the IO device interface module 62 and/or the memory interface modules may be collectively or individually referred to as IO ports.

The processing module 50 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 50 may have an associated memory and/or memory element, which may be a single memory device, a plurality of memory devices, and/or embedded circuitry of the processing module 50. Such a memory device may be a read-only memory, random access memory, volatile memory, non-volatile memory, static memory, dynamic memory, flash memory, cache memory, and/or any device that stores digital information. Note that if the processing module 50 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 50 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 50 executes, hard coded and/or operational instructions corresponding to at least some of the steps and/or functions illustrated in FIGS. 1-21.

Figure 3:
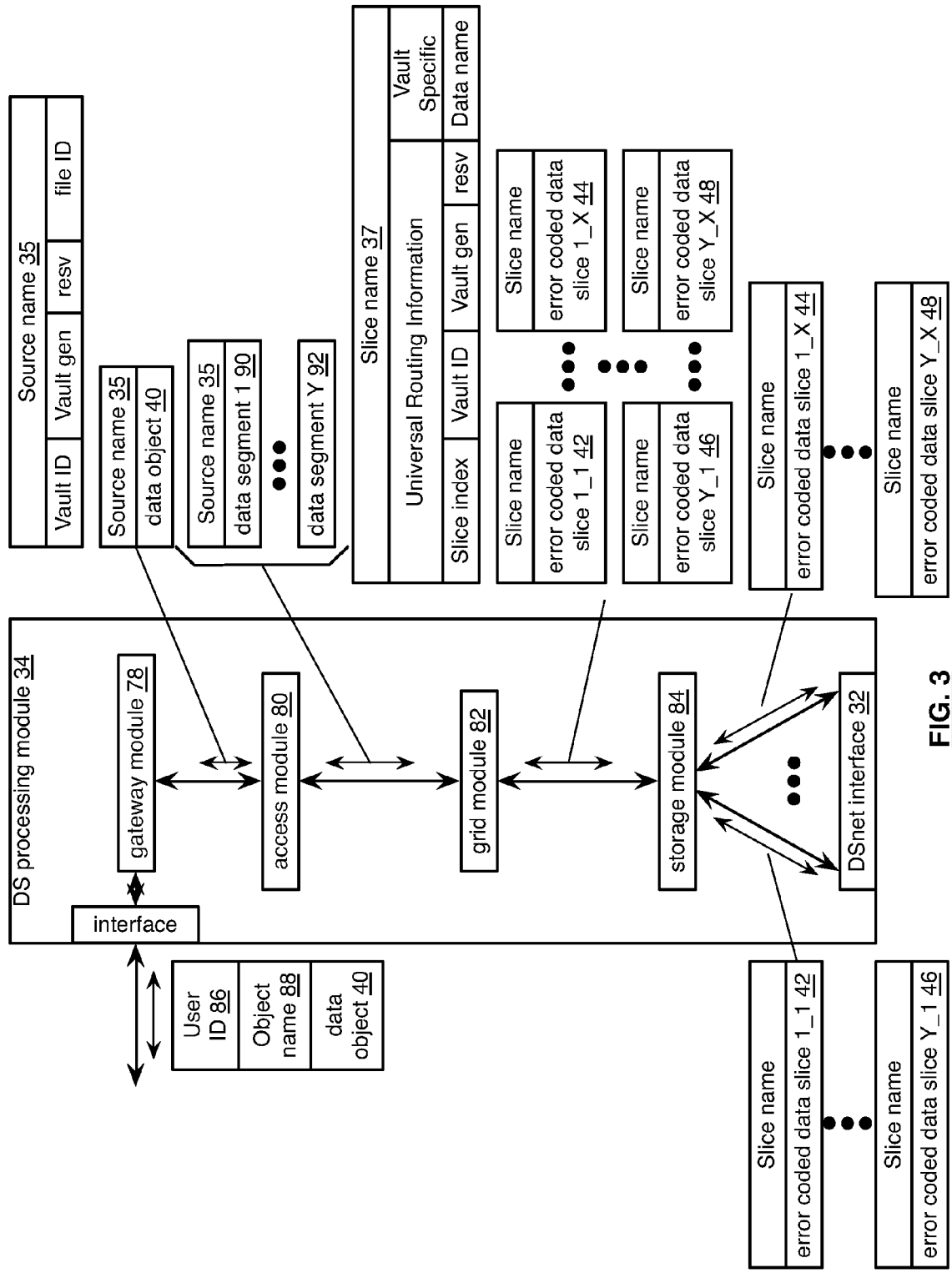
FIG. 3 is a schematic block diagram of an embodiment of a distributed storage processing unit in accordance with the invention.

FIG. 3 is a schematic block diagram of an embodiment of a distributed storage (DS) processing unit 34 that includes the interface, a gateway module 78, an access module 80, a grid module 82, a storage module 84, and the DSnet interface 32. In another embodiment, one or more of the gateway module 78, the access module 80, the grid module 82, and the storage module 84 may be implemented outside of the DS processing unit 34. The DS processing unit 34 may receive a user identification (ID) 86, an object name 88, and a data object 40 (e.g., data file, data block, media data, streaming media) from the user device via the interface in a store scenario.

The DS processing unit 34 functions includes the transformation of incoming data objects 40 (e.g., data files, data blocks, streams) from the interface into error coded (EC) data slices 42-48, with attached slice names, which the DS processing unit stores in the DSN memory via the DSnet interface. The DS processing unit 34 retrieves EC data slices 42-48, with attached slice names, from the DSN memory and transforms the EC data slices 42-48 into data objects 40, which the DS processing unit 34 communicates via the interface.

The interface of the DS processing unit 34 is coupled to the interface of the second type of user device. The interfaces may be logical if the DS processing unit 34 is part of the first type of user device. The interfaces collectively form a DSN memory interface to accommodate the OS file system of the user device such that, from the perspective of the user device, data objects may be stored to and retrieved from the DS processing unit 34 as if the DS processing unit 34 were any other compatible storage system.

The gateway module 78 couples the interface to the access module 80 and may include functions to act as a portal between the user device and the DS processing unit 34 allowing them to communicate between protocols providing computing system interoperability. The gateway module 78 converts protocols and messages as a function of the user device OS file system. For example, the gateway module 78 converts a retrieve-file message in the NFS protocol format from the second type of user device to a distributed storage network message in the distributed storage network protocol to trigger the DS processing unit 34 to retrieve the data and return it to the first user device. The gateway module 78 may include other functions including access control to prevent unauthorized use, user identification, user information retrieval, traffic monitoring, statistics generation, DS processing unit configuration, and DS processing unit management. The gateway module 78 may provide user access authentication to verify a user has permissions to perform one or more DSN memory access functions including write, read, delete, list, status, configure, and/or other functions that access the DSN memory.

The gateway module 78 may access user information based on the user ID 86. The gateway module 78 receives the user ID 86 and looks up a vault identifier (ID) in a registry list. The vault associated with each user may contain user attributes (e.g., who it is, billing data, etc.), operational parameters, and a list of the DS units that will be utilized to support the user. One or more vaults may be established from the same set of DS units in different combinations. A vault identifier (ID) is utilized to distinguish between vaults. For example, vault 1 (for user 1) will utilize DS units 3, 10, 31, 46, 52, 55, 65, and 68 (n=8 wide) while vault 2 (user 2) will utilize DS units 3, 8, 31, 26, 40, 45, 46, 49, 55, 57, 58, 60, 62, 63, 68, and 72 (n=16 wide).

The operational parameters may include one or more of the error coding algorithm, the width n (number of pillars or slices per segment for this vault), the threshold k (described below), the encryption algorithm, a slicing parameter, a compression algorithm, an integrity check method, caching settings, parallelism settings, and/or other parameters that may be used to access the DSN memory.

The gateway module 78 may access user information from the vault associated with the user from any one or more sources including the DS managing unit, the user device, the DSN memory, and/or a source external to the computing network. The gateway module 78 may determine a source name 35 to associate with the data object 40. The source name 35 may contain a file identifier (ID), a vault generation number, a reserved field, and the vault identifier. The file ID may be randomly assigned but it is always associated with the user data object 40. The gateway module 78 saves a newly assigned file ID along with the corresponding object name 88 in the user registry such that the file ID may be determined on subsequent data object 40 retrievals. The vault generation number specifies sub-sections of the vault. The reserved field holds in reserve bits for future use. The gateway module 78 may pass the user information, source name 35, and data object 40 to other elements of the DS processing unit 34.

In an embodiment, the access module 80 communicates data objects 40, user information, and the source name 35 with the gateway module 78, and data segments 90-92, user information, and the source name 35 with the grid module 82. The access module 80 creates a series of data segments 90-92 1 through Y from the data object 40 to be stored. In one embodiment, the number of segments Y is chosen (e.g., part of the user information) to be a fixed number for a given user vault, but the size of the segments varies as a function of the size of the data object 40. For instance, if the data object 40 is an image file of 4,194,304 eight bit bytes (e.g., 33,554,432 bits) and the number of segments Y=131,072, then each segment is 256 bits or 32 bytes. In another embodiment, the number of segments Y is a variable number based on the size of each data file with the objective to have a constant size of the data segments 90-92 (e.g., data segment size is specified in the user information). For instance, if the data object 40 is an image file of 4,194,304 bytes and the fixed size of each segment is 4,096 bytes, then the number of segments Y=1, 024.

The access module 80 may include the source name in each data segment 90-92 before passing the data segment 90-92 to the grid module 82.

The grid module 82 may pre-manipulate (e.g., perform compression, encryption, cyclic redundancy check (CRC), etc.) the data segment 90-92 before creating n error coded data slices for each data segment 90-92. The grid module 82 creates nY error coded data slices 42-48 for the Y data segments 90-92 of the data object 40. The grid module 82 adds forward error correction bits to the data segment bits in accordance with an error coding algorithm (e.g., Reed-Solomon encoding, Convolution encoding, Trellis encoding, etc.) to produce an encoded data segment. The grid module 82 determines the slice name 37 and attaches the unique slice name 37 to each EC data slice 42-48.

The slice name 37 includes a universal routing information field and a vault specific field. In an embodiment, the universal routing information field is 24 bytes and the vault specific field is 24 bytes. The universal routing information field contains a slice index, the vault ID, the vault generation, and the reserved field. The slice index is based on the pillar number n and the vault ID such that it is unique for each pillar (e.g., slices of the same pillar for the same vault for any segment will share the same slice index). The vault specific field contains a data name that may include the file ID and a segment number (e.g., a sequential numbering of the data segments 90-92 of a simple data object 40 or a data block number).

The data name field may be the same for slice names of slices for the same data segment and may vary for slice names of different data segments. The file ID portion of data name may not vary for any slice name 37 of the same data object 40. Note that the DS processing unit 34 may modify the data name field such that the file ID is not transparent (e.g., produce a data name from a hash of the source name to disguise the file ID).

The number of pillars, or slices n per data segment 90-92 (e.g., n=16) is chosen as a function of the error coding objectives. A read threshold k (e.g., k=10) of the error coding algorithm is the minimum number of error-free error coded data slices required to be able to reconstruct a data segment 90-92. The DS processing unit 34 can compensate for n-k (e.g., 16-10=6) missing error coded data slices 42-48 per data segment 90-92.

The grid module 82 slices the encoded data segment to produce the error coded data slices 42-48. The slicing complements the error coding algorithm and accommodates the nature of dispersing error coded data slices to different DS units of the DSN memory. The grid module 82 may use interleaving to slice the encoded data segment such that if an entire error coded slice 42-48 is lost it will not destroy a large contiguous portion of the data segment 90 preventing reconstruction.

The size of each error coded data slice 42-48 is a function of the size of the data segment 90 and the error coding algorithm. The size of each error coded data slice 42-48 is the size of the data segment 90 divided by the threshold k. For example, if the data segment 90 is 32 bytes and the threshold is 10, then each error coded slice 42-48 (without any slice name virtual address) is about 4 bytes.

The grid module 82 may perform post-data manipulation on the error coded data slices 42-48 where the manipulation may include one or more of slice level compression, encryption, CRC, addressing, tagging, and/or other manipulation to improve the effectiveness of the computing system.

The grid module 82 may determine which DS units to store each error coded data slice 42-48 based in part on a distributed storage memory mapping associated with the user's vault. Such a mapping may be stored in a virtual DSN address to physical location table. The location determination may also be based in part on DS unit attributes including one or more of memory type, memory model, operating system type, availability, self-selection, performance history, link speed, link latency, ownership, available memory, domain, cost, and more generally on one or more of a prioritization scheme, a centralized selection message from another source, a lookup table, who owns the data, and/or any other factor to optimize the operation of the computing system. The grid module 82 will pass the DS unit determinations on to the storage module 84 so that the storage module 84 can direct the EC data slices properly. The method to choose DS units will be discussed in greater detail with reference to FIGS. 4-21.

In an embodiment, the number of DS units is equal to or greater than the number of pillars (slices n per segment) so that no more than one error coded data slice 42-48 of the same data segment 90 is stored on the same DS unit. Error coded data slices 42-48 of the same slice number but of different segments (e.g., EC data slice 1 of data segment 1 and EC data slice 1 of data segment 2) may be stored on the same or different DS units.

The grid module 82 will pass the EC coded data slices 42-48 (including the slice names) with DS unit determinations (e.g., the DS unit numbers) to the storage module 84. Note that the group of DS units chosen for each of the n pillars forms a storage set.

The storage module 84 may perform integrity checks on the EC data slices 42-48 and then transmit the EC data slices 1 through X of each segment 1 through Y to the DS units according to the previous location determination with a store command via the DSnet interface 32. The DS units will store the EC data slices 42-48 locally and update a local virtual DSN addresses to physical storage address table. The DS unit may choose which memory device to store each slice based on a metadata for the slice and memory characteristics of the DS unit memory. The method to choose DS units and memory will be discussed in greater detail with reference to FIGS. 4-21.

In an example of operation, the second type of user device sends a data file retrieval message to the DS gateway module 78 of the DS processing unit 34. The gateway module 78 translates the data file retrieval from the conventional file system interface into a retrieval message of a DSN memory interface convention. The grid module 82 receives the retrieval message and determines where (e.g., which DS units) the EC data slices 42-48 for each segment of the data file should be based on a table linking slice names to DS units. The storage module 84 retrieves the EC data slices 42-48 from each of the determined DS units and passes the retrieved EC data slices 42-48 to the grid module 82. The storage module 84 may only retrieve the threshold k number of EC data slices 42-48 if they are known to be intact (e.g., no CRC errors etc. as indicated by the DS unit and/or by the grid module 82). The grid module 82 de-slices the EC data slices 42-48 and decodes the de-sliced data in accordance with the error coding algorithm to produce the data segments 90-92. The grid module 82 passes the data segments 90-92 to the access module 80 which re-assembles the data file by aggregating the data segments 90-92 in order. The access module 80 passes the data file to the gateway module 78 which converts the format to the file system protocol of the second type of user device.

Figure 4:
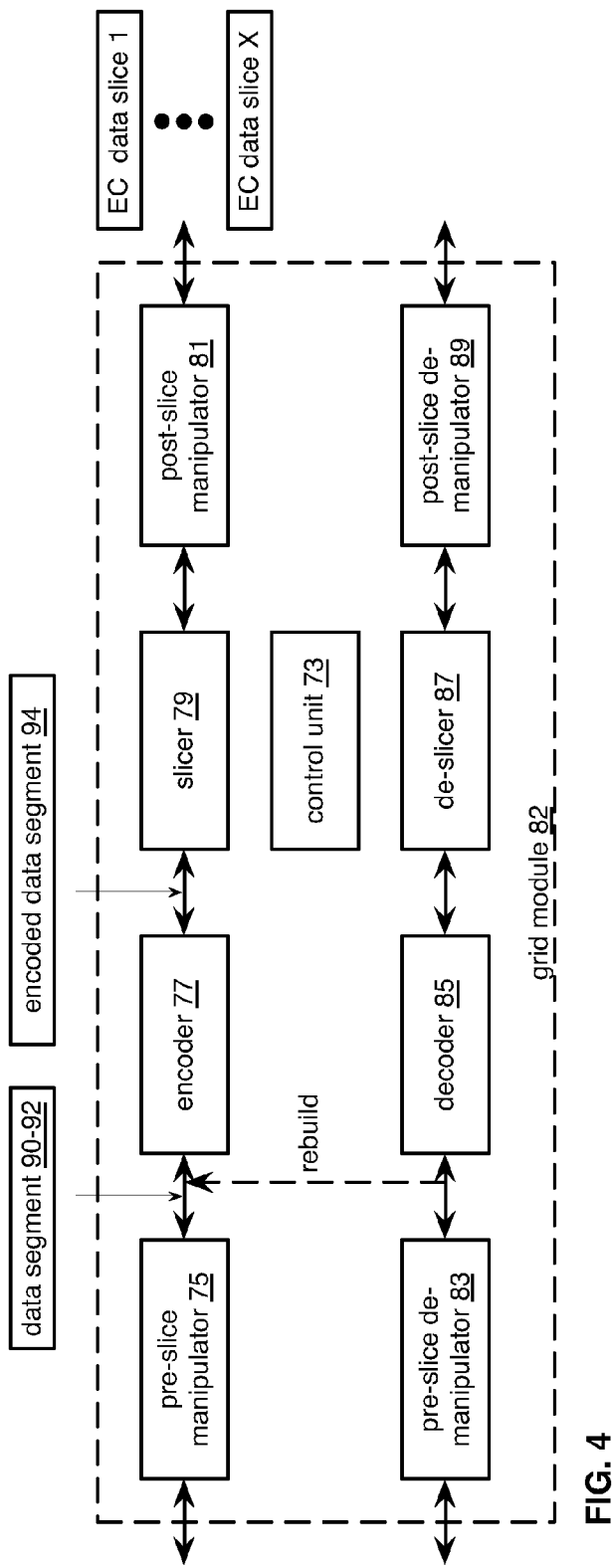
FIG. 4 is a schematic block diagram of an embodiment of a grid module in accordance with the invention.

FIG. 4 is a schematic block diagram of an embodiment of a grid module 82 that includes a control unit 73, a pre-data manipulator 75, an encoder 77, a slicer 79, a post-data manipulator 81, a pre-data de-manipulator 83, a decoder 85, a de-slicer 87, and a post-data de-manipulator 89. In another embodiment, the control unit 73 is partially or completely external to the grid module 82. For example, the control unit 73 may be part of the computing core at a remote location, part of a user device, part of the DS managing unit of FIG. 1, or distributed amongst one or more DS units.

The control unit 73 may assist or control the other elements of the grid module 82 to determine operational parameters which may include what, if any, types of pre-data manipulation/de-manipulation are to be applied to an incoming/outgoing data segments 90-92, what type of error encoding/decoding to apply to the (encoded) data segments 94, how to slice/de-slice the encoded data segments/error coded data slices, what, if any, types of post-data manipulation/de-manipulation are to be applied to outgoing/incoming error coded data slices 94, DS storage memory mapping, status of DS units, performance history of DS units, capability of DS units, prioritization information for DS unit usage, and when to rebuild data. The control unit 73 may determine the operational parameters by combining parameters of the associated vault with other parameters, which will be discussed below.

In an example of operation, the pre-data manipulator 75 receives the data segment 90-92 and a write instruction from an authorized user device. The control unit 73 or gateway module may assist the pre-data manipulator 75 to determine the vault for this user and the data segment 90-92. The pre-data manipulator 75 determines if pre-manipulation of the data segment 90-92 is required, and if so, what type of pre-manipulation. The determination may be based on one or more factors including the security parameters, a computing system-wide predetermination, a table lookup, vault parameters associated with the user identification, the type of data, security requirements, available DSN memory, performance requirements, and/or other metadata.

The pre-data manipulator 75 may manipulate the data segment 90-92 in accordance with the manipulation determination. The manipulation may include one or more of compression (e.g., Lempel-Ziv-Welch, Huffman, Golomb, fractal, wavelet, etc.), transcoding (e.g., from one compression method to another), signatures (e.g., Digital Signature Algorithm (DSA), Elliptic Curve DSA, Secure Hash Algorithm, etc.), watermarking, tagging, encryption (e.g., Data Encryption Standard, Advanced Encryption Standard, etc.), adding metadata (e.g., time/date stamping, user information, key information, file type, etc.), cyclic redundancy check (e.g., CRC32), and/or other manipulations to enhance the value of the data segment 90-92. Note that the pre-data de-manipulator 83 performs the complementary functions of the pre-data manipulator 75 when data is retrieved from the DSN memory. Note that the pre-data manipulator 75 and pre-data de-manipulator 83 are bypassed when data is recovered and reconstructed in the rebuild path.

The encoder 77 receives the data segment 90-92 from the pre-data manipulator 75 and encodes the data segment 90-92 using a forward error correction (FEC) encoder to produce the encoded data segment 94. The encoder 77 determines what type of encoding algorithm to use based on factors including one or more of the security parameters, predetermination in the vault for this user and/or data segment 90-92, a time based algorithm, user directed, DS managing unit directed, as a function of the data type, as a function of the data segment metadata, and/or any other factor to determine algorithm type. The encoder 77 may utilize a different encoding algorithm for each data segment 90-92, or the same encoding algorithm for all data segments, or some other combination. The encoder 77 may determine the encoding algorithm type to be one of Golay, Multidimensional parity, Reed-Solomon, Hamming, Bose Ray Chauduri Hocquenghem (BCH), Cauchy-Reed-Solomon, or any other FEC encoder. The encoded data segment 94 is of greater size than the data segment 90-92 by the overhead rate of the encoding algorithm. The encoded data segment 94 is d(n/k), where d is size of the data segment 90-92, n is the width or number of slices, and k is the threshold or minimum number of received slices to enable recreation of the data segment 90-92. The corresponding decoding process can accommodate at most n-k missing EC data slices and still recreate the data segment 90-92. For example, if n=16 and k=10, then the data segment 90-92 may be recoverable, even if at most 6 EC data slices per segment are corrupted or missing. Note that the decoder 85 performs the complementary functions of the encoder 77 when data is retrieved from the DSN memory.

The slicer 79 receives the encoded data segment 94 from the encoder 77 and transforms the encoded data segment 94 into EC data slices in accordance with the slicing parameter from the vault for this user and/or data segment 90-92. In one embodiment, data segments 90-92 are packed one for one into a data slice. In this instance, it is possible to correct many data slices with this method if the error patterns are substantially manifested as individual bit errors. In another example of this instance, entire slices may be lost and hence entire data segments 90-92 may not be recoverable. In another embodiment, a data segment 90-92 is dispersed across many data slices (e.g., n wide pillars) to lessen the impact on a given data segment 90-92 when an entire data slice is lost. Less data per segment is lost, when a data slice is lost, as the data segment 90-92 is dispersed across more slices. The slicing is discussed in greater detail with reference to FIG. 5. Note that the de-slicer 87 performs the complementary functions of the slicer 79 when data is retrieved from the DSN memory.

The post-data manipulator 81 receives EC data slices from the slicer 79. The post-data manipulator 81 determines if post-manipulation of the EC data slices is required, and if so, what type of post-manipulation. The determination may be driven by one or more factors including one or more of the security parameters, a computing system-wide predetermination, parameters in the vault for this user, a table lookup, the user identification, the type of data, security requirements, available DSN memory, performance requirements, and/or other metadata. The post-data manipulator 81 manipulates the EC data slice in accordance with the manipulation determination. The manipulation may include one or more of slice level compression, signatures, encryption, CRC, addressing, watermarking, tagging, adding metadata, and/or other manipulation to improve the effectiveness of the computing system. The post-data manipulator 81 passes the resulting EC data slices, with the attached slice name, to the storage module for storage in the DSN memory. Note that the post-data de-manipulator 89 performs the complementary functions of the post-data manipulator 81 when data is retrieved from the DSN memory.

In an example of operation, the grid module 82 may perform a rebuilder operation to repair a particular data segment 90-92 that has known missing or bad EC data slices, but not so many to not be able to recover the data segment 90-92. The rebuilder process objective is to re-establish good EC data slices for the segment in the DSN memory. The rebuilder process may execute on one or more of the storage integrity processing unit, the DS processing unit, the DS managing unit, the DS unit, and/or the user device. The grid module 82 may determine that a data segment 90-92 is to be rebuilt based on data error detection or it may receive a command from another unit such as the storage integrity processing unit, the DS managing unit, the DS unit, and/or the user device. The other unit may determine data segments that require rebuilding by executing a scanning algorithm to look for data errors such as missing or corrupted EC data slices, failed DS units, and/or failed sites.

The grid module 82 may rebuild the data segment 90-92 by retrieving enough EC data slices (e.g., k slices) to de-slice and decode the data segment 90-92, re-encode the data segment 90-92, slice the data segment 90-92, and pass the EC data slices to the DSN memory. The grid module 82 may determine the vault parameters based on the vault identifier in the slice name attached to the rebuild command. The grid module 82 may utilize the vault parameters to perform the functions including to determine which DS units to access for each slice, to determine what type of post-data de-manipulation to perform, how to de-slice the EC data slices, how to decode the de-sliced encoded data, which decoding algorithm to use to decode the encoded data segment 94 into the data segment 90-92, which encoder 77 to use to re-encode the data segment 90-92, how to slice the encoded data segment 94, and to determine what type of post-data manipulation to perform before re-attaching slice names and storing to the associated DS units.

Figure 5:
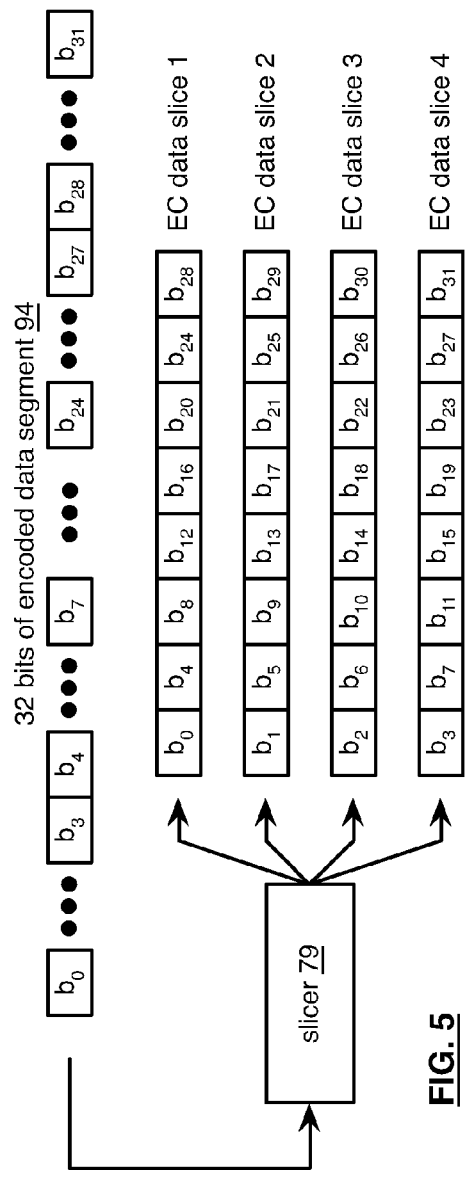
FIG. 5 is a diagram of an example embodiment of error coded data slice creation in accordance with the invention.

FIG. 5 is a diagram of an example embodiment of error coded data slice creation where the slicer 79 creates four EC data slices from a thirty two bit encoded data segment 94. The slicer 79 disperses the bits from the encoded data segment 94 across the EC data slices wrapping around from the last slice to the first slice over and over. Each EC data slice, for this data segment 94, is stored on a different DS unit. In this example, encoded data segment bits 1, 5, 9, 13, 17, 25, and 29 may be unavailable if EC data slice 2 is lost. As such, a long sequential string of bits is not missing and the decoding algorithm can recreate those missing bits based on the remaining EC data slice bits. More slices ensure a larger distance between encoded data segment bits in a given slice, which improves the error resiliency of losing one or more slices.

Figure 6:
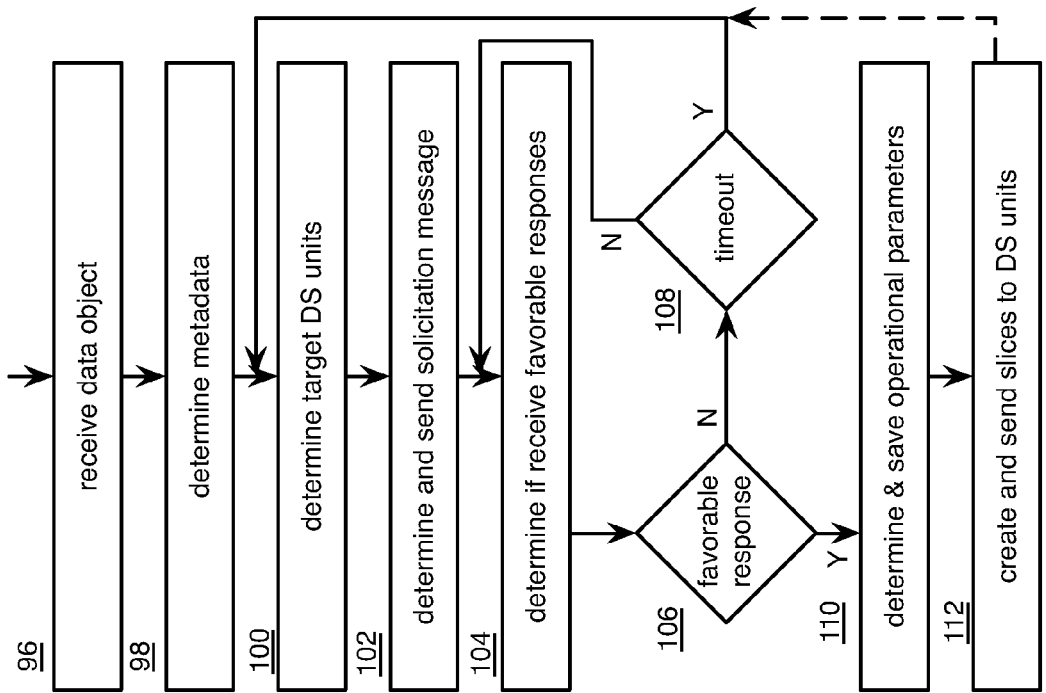
FIG. 6 is a flowchart illustrating the storing of slices in accordance with the invention.

FIG. 6 is a flowchart illustrating the storing of slices where the DS processing coordinates the determination of DS units to store slices to by way of a solicitation method described below. In other words, the DS processing requests that the DS units determine their participation in storing data rather than the DS processing making the participation determination.

The method begins with the step of the DS processing receiving a data object to store (e.g., from a user device) 96. The DS processing may receive the user ID, the data object name, and metadata associated with the data object.

The DS processing determines metadata where the metadata may include one or more of, but is not limited to a hash of the data object, a priority requirement, a security requirement, a performance requirement, a size indicator, a data type indicator, a location requirement, and/or a user ID 98. The determination may be based on one or more of the received metadata, the user ID, the data object name, a data type indicator, the data object, a calculated hash of the data object, a priority indicator, a security indicator, a performance requirement, a command, a user vault lookup, geographic location of the user device, a location requirement, and/or a predetermination.

The DS processing determines target DS units where the target DS units represent DS units that the DS processing will subsequently solicit to store slices 100. The determination may be based on one or more of, but is not limited to the metadata, a DS unit list, geographic locations of DS units, geographic location of the user device, a command, a predetermination, a DSN memory status indicator, a DS unit solicitation response history indicator, and/or a DSN memory performance indicator. The DS processing may select target DS units that are estimated to at least meet the requirements indicated by the metadata and may meet other requirements imposed by a command or a predetermination. For example, the DS processing may target DS units with estimated sufficient memory, that have not been solicited yet for this sequence, and that are within a five mile radius of geographic proximity to the user device to provide enhanced performance.

The DS processing determines a solicitation message for the target DS units that includes a solicitation request, the metadata, and may include the requirements summary 102. The DS processing sends the solicitation message to the target DS units 102. Note that the DS processing may send the solicitation message to the target DS units by way of one or more of a broadcast (e.g., all DS units), a unicast (e.g., one DS unit at a time), and/or a multicast (e.g., to a subset of DS units organized into a subset) transmission.

The DS processing receives a solicitation response from one or more DS units where the solicitation response includes a favorable or unfavorable indicator 104. The response may also include a DS unit capability indicator (e.g., how much memory is available, a performance indicator, etc). A favorable indicator indicates that the DS unit is willing to store slices and an unfavorable indicator indicates that the DS unit is not willing to store slices. In another embodiment, the DS unit may only send a solicitation response that includes the favorable indicator (e.g., it does not send a response with the unfavorable indicator). The method of the DS unit determination of the solicitation response is discussed in greater detail with reference to FIG. 7.

The DS processing determines if sufficient responses have been received that include the favorable indicator and that will meet the requirements of a sequence 106. Note that the DS processing may be in a sequence to store one slice, a batch of data segment slices for one same pillar, more than one batch of data segment slices for one or more pillars, up to all slices for each data segment of the data object. In other words, the DS processing is looking for a sufficient number of DS units that will meet the sequence needs and meet the functional and performance requirements based on the metadata.

The DS processing determines if a timeout has occurred when the DS processing determines that sufficient favorable responses has not been received so far 108. The timeout time period may start when the DS processing sent the solicitation message. The method branches back to the step where the DS processing receives responses 104 and determines if sufficient favorable responses have been received when the DS processing determines that the timeout has not occurred. The method branches back to the step where the DS processing determines the target DS units 100 when the DS processing determines that the timeout has occurred. Note that the DS processing may try other DS units that were not sent the solicitation method so far. Further note that the method may continue in this loop for several iterations and in another embodiment, the DS processing may retry DS units that have been sent the solicitation message (e.g., the DS unit status may have changed).

The DS processing determines the operational parameters (e.g., discussed with reference to FIG. 3, and to include the DS unit choices) based on one or more of, but not limited to the metadata, the number of favorably responding DS units, the DS unit capability indicator, a command, a predetermination, and/or a user vault lookup when the DS processing determines that sufficient favorable responses have been received 110. For example, the DS processing may choose the pillar width n to be less than the number of favorably responding DS units and much larger than the read threshold k for storing a data segment in a storage set when utilizing this solicitation method. In another example, the DS processing may choose multiple storage sets comprising the favorably responding DS units such that the slices of different data segments may be sent to different storage sets. The DS processing may include the storage set choices in the operational parameters.

The DS processing may save the operational parameters in the user vault and/or another memory 110. The DS processing may or may not save the DS unit choices (e.g., per slice name) in the user vault, a virtual DSN address (e.g., slice name) to physical location table, and/or another memory. In one embodiment, the DS processing performs subsequent slice retrievals through another solicitation method when the DS processing does not save the DS unit choices. In another embodiment, the DS processing performs subsequent slice retrievals by looking up in memory where the slices are stored when the DS processing saves the DS unit choices. The retrieval method is discussed in greater detail with reference to FIGS. 8-9.

The DS processing encodes and slices the data object to create the slices in accordance with the operational parameters 112. The DS processing sends the slices to the DS unit choices with a store command for subsequent storage in the DS units in accordance with the operational parameters 112. Note that the DS processing may send one slice, all the slices batched for a pillar of a data segment, all the slices of a data segment, all the slices of all the data segments of the data object. The method may branch back to the step where the DS processing determines target DS units when the DS processing is not finished creating and sending slices for the data object. For example, the loop described above may repeat for the next data segment.

Figure 7:
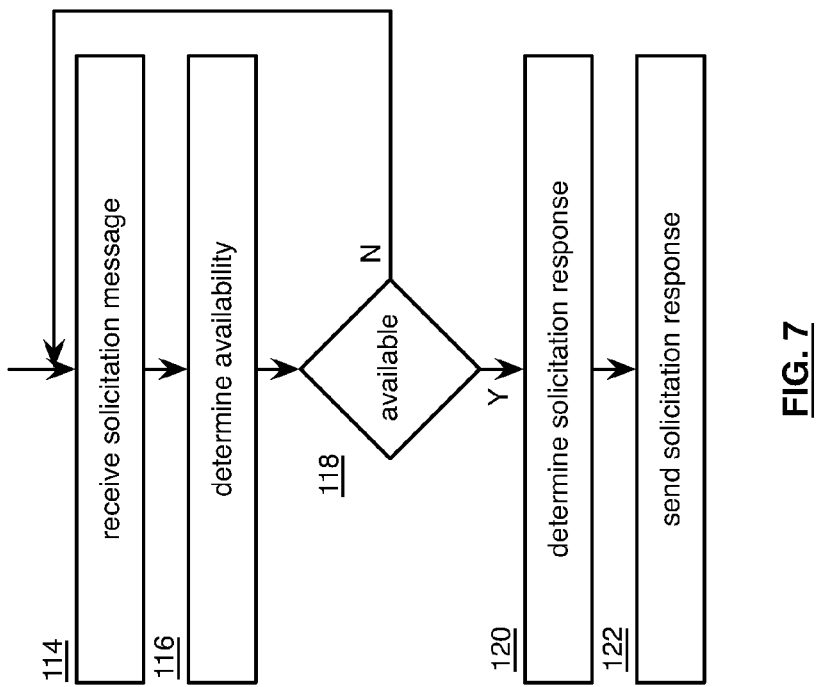
FIG. 7 is a flowchart illustrating the response to a solicitation to store slices in accordance with the invention.

FIG. 7 is a flowchart illustrating the response to a solicitation to store encoded data slices where the DS unit determines how to respond to receiving a solicitation message from the DS processing. The method begins with the DS unit receiving the solicitation message from the DS processing 114. The solicitation message may include the metadata (e.g., requirements).

The DS unit determines its availability based on one or more of the metadata, DS unit status, DS unit memory availability, a command, a predetermination, historic DS unit performance, and/or DS unit loading 116. For example, the DS unit compares the memory requirements from the metadata to the memory availability and determines that the DS unit is available for this solicitation when the amount of available memory is greater than the memory requirements 118. The method branches back to the step of the DS unit receiving the solicitation message when the DS unit determines that the DS unit is not available 114. In another embodiment, the DS unit sends a solicitation response message to the DS processing that includes the unfavorable indicator.

The DS unit determines the solicitation response message when the DS unit determines that the DS unit is available 120. The solicitation response message may include the favorable indicator and the DS unit capability indicator. Note that the DS unit may offer to store a portion of the amount requested in the solicitation. For example, the DS unit may indicate it can store 500 megabytes in the DS unit capability indicator when the solicitation request metadata indicated that 1 gigabyte was requested. Note that the DS processing reconciles the difference by ensuring that a sufficient number of DS units are available to meet the total requirements.

The DS unit sends the solicitation response message to the DS processing that sent the solicitation 122. The DS unit may subsequently receive a store command, metadata, the object name, slice names, and slices to store from the DS processing. In another embodiment, the DS unit may or may not store a portion of the slices in favor of forwarding at least a portion of the slices to another DS unit for storage. A method to determine forwarding slices is discussed in greater detail with reference to FIGS. 11 and 14.

Figure 7A:
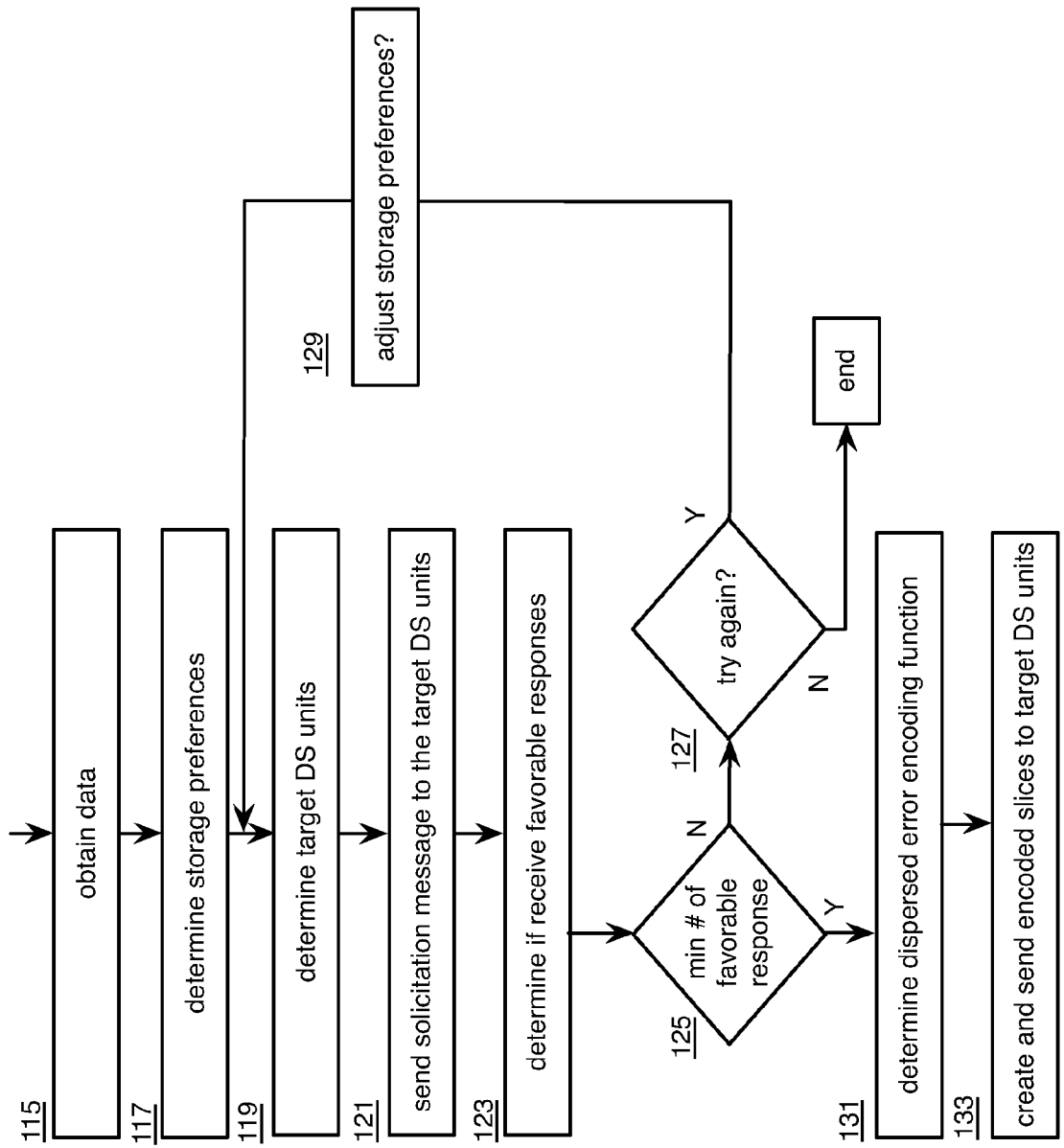
FIG. 7A is a flowchart illustrating another example of the response to a solicitation to store slices in accordance with the invention.

FIG. 7A is a flowchart illustrating a method that is executable by one or more processing modules of one or more computing devices to store encoded data slices within a plurality of DS units that are hosted by one or more storage as service entities. The method begins at step 115 where the processing module obtains a data object to store (e.g., retrieving the data from memory, receiving the data from a device in the DSN, or creating the data).

The method continues at step 117 where the processing module determines storage preferences regarding the data. The storage preferences may be based on the data and/or the source of the data. For example, the storage preferences are based on the type of data, data size, data application (e.g. Word, Excel, JPEG, etc.) and the usage of the data. In another example, the storage preferences are based on the user ID, geographic location requirements for physical location of the storage units, a user device ID associated with the data, a reliability preference (e.g. reliability and/or availability of a storage, etc.), and a retrieval preference (e.g. speed of retrieval rate, bandwidth availability, storage costs, etc.)

The method continues at step 119 where the processing module determines target DS units for storage as service solicitation. The targeted DS units may be in one DSN memory 22 supported by one storage as service provider, may be in multiple DSN memories 22*a-n* supported by one storage as service provider, or may be in multiple DSN memories 22*a-n* supported by multiple storage as service providers. The determination is based on the storage preferences regarding the data and the source of the data. For example, the DS processing may target DS units with estimated sufficient memory, that have not been solicited yet for this sequence, and that are within a five mile radius of geographic proximity to the user device to provide enhanced performance.

The method continues at step 121 where the processing module sends a solicitation message that includes a representation of the storage requirements to the target DS units. Note that the DS processing may send the solicitation message to the target DS units by way of one or more of a broadcast (e.g., all DS units), a unicast (e.g., one DS unit at a time), and/or a multicast (e.g., to a subset of DS units organized into a subset) transmission.

The method continues at step 123 where the processing module receives a solicitation response from one or more target DS units where the solicitation response is favorable or unfavorable. The response may also include a DS unit capability indicator (e.g., how much memory is available, a performance indicator, etc). A favorable response indicates that the DS unit is willing to store slices and an unfavorable response indicates that the DS unit is not willing to store slices.

The method continues at step 125 where the processing module determines whether a minimum number of favorable solicitation responses have been received within a given time frame. The minimum number corresponds to an acceptable, but least desirable, number of storage units favorably responding such that minimally desirable encoding parameters (e.g., a slicing pillar width number of five and a decode threshold of three) may be used. For this example, of five being the minimum number of acceptable favorable responses, any number above five would also satisfy this condition and provide more options in selecting the encoding parameters. The minimum number may take into account whether one or more encoded data slices of a set of encoded data slices will be stored locally. For example, if it is determined that 1 encoded data slice per set will be stored locally and four storage units provide a favorable response, then the minimum number of five is still met.

If, at step 125, a minimum number favorable number of solicitation responses have been received within a given time frame, the method continues at step 131 where the processing module determines the dispersed error encoding function based on one or more of the number of favorable solicitation responses, the storage preferences, and available encoding schemes. Available encoding schemes include but are not limited to a segmenting protocol, a pre-slice data manipulation function, a first forward error correction encoding function, a slicing pillar width, a post-slice data manipulation function, a write threshold, and a read threshold. For example, if sixteen favorable responses are received, the processing module may select only eight of the sixteen DS units to use and then select 1 MB data segmenting using a Reed Solomon encoding scheme with a slicing pillar width number of eight and a decode threshold number of five. As another option, the processing module may select to use all sixteen DS units and then select a 10 MB data segmenting using a Cauchy Reed Solomon encoding scheme with a slicing pillar width number of sixteen and a decode threshold number of ten.

The processing module may also take into account whether one or more encoded data slices are to be stored locally when determining the dispersed error encoding function. For example, if sixteen favorable responses are received, and two encoded data slices are to be stored locally, the processing module may choose a slicing pillar width number of eighteen and a decode threshold number of twelve. As another option, the processing module could choose a slicing pillar width number of sixteen and a decode threshold number of ten and only use fourteen of the sixteen DS units.

The method continues at step 133 where the processing module encodes and slices the data to create the encoded data slices in accordance with the selected dispersed error encoding function. The processing module then sends the encoded data slices to at least some of the DS units that provided favorable solicitation responses. The processing module may also store some encoded data slices locally. The processing module may store a file path for the data that includes the memory addresses of the storage units and a file name of the data. The file path may include a name of the data, user information, DSN addressing information, slice names, and/or metadata that identifies the data and where it is stored within the DSN memory or DSN memories.

If, at step 125, a minimum number of favorable solicitation responses has not been received within a given time frame, the method continues at step 127 where the processing determines whether to retry. If the processing module determines to retry, the method continues at step 129 where the processing module determines whether to adjust the storage preferences. With or without adjusting the storage preferences, the method then branches back to step 119 where the processing module determines target DS units for storage as service solicitation. If, at step 127, the processing module determines to not retry, the method ends.

Figure 8:
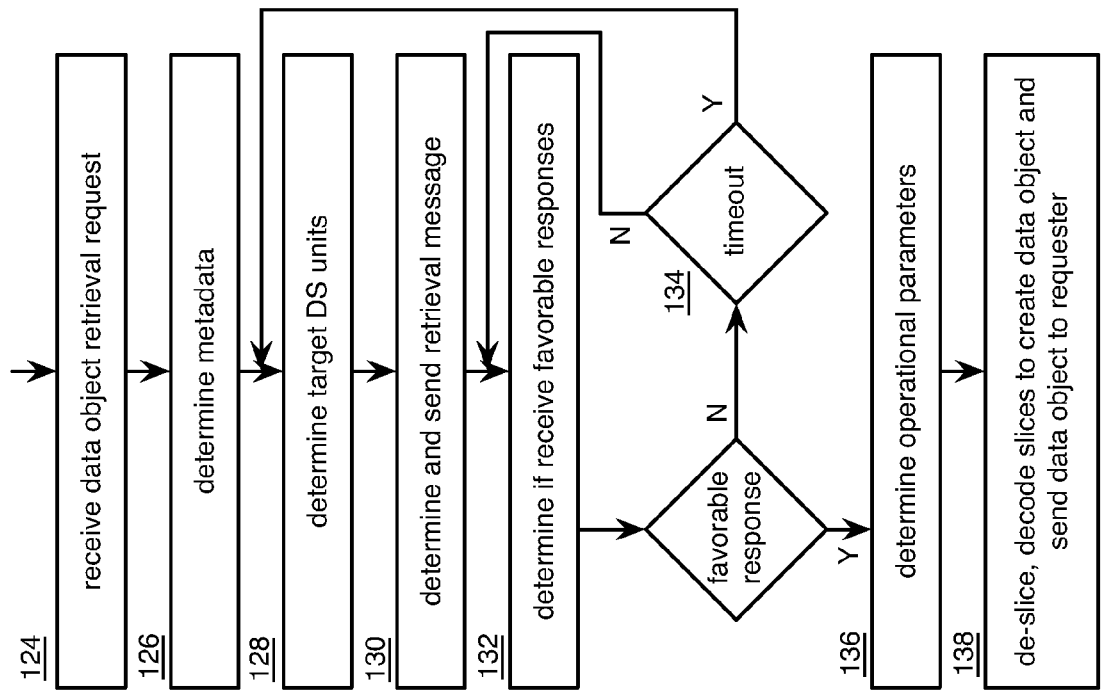
FIG. 8 is a flowchart illustrating the retrieving of slices in accordance with the invention.

FIG. 8 is a flowchart illustrating the retrieving of slices where the DS processing coordinates the determination of DS units to try to retrieve slices by way of a retrieval solicitation method described below. In other words, the DS processing requests that the DS units that are likely to contain desired slices send them to the DS processing rather than the DS processing requesting slices from particular DS units that are known to contain the desired slices.

The method begins with the step of the DS processing receiving a request to retrieve a data object (e.g., from a user device) 124. The DS processing may receive the user ID, the data object name, and metadata associated with the data object.

The DS processing determines metadata where the metadata may include one or more of, but is not limited to a hash of the data object, a priority requirement, a security requirement, a performance requirement, a size indicator, a data type indicator, a location requirement, and/or a user ID 126. The determination may be based on one or more of the received metadata, the user ID, the data object name, a data type indicator, a previously calculated hash of the data object, a priority indicator, a security indicator, a performance requirement, a command, a user vault lookup, geographic location of the user device, a location requirement, and/or a predetermination.

The DS processing determines target DS units where the target DS units represent DS units that the DS processing will subsequently solicit to retrieve slices 128. In other words, these are the DS units where the slices are most likely stored. The determination may be based on one or more of, but is not limited to the metadata, a DS unit list, geographic locations of DS units, geographic location of the user device, a command, a predetermination, a DSN memory status indicator, a DS unit solicitation response history indicator, and/or a DSN memory performance indicator. The DS processing may select target DS units that are estimated to at least meet the requirements indicated by the metadata and may meet other requirements imposed by a command or a predetermination. For example, the DS processing may target DS units with estimated sufficient memory, that have not been solicited yet for this sequence, and that are within a five mile radius of geographic proximity to the user device to provide enhanced performance.

The DS processing determines a retrieval message for the target DS units that includes a retrieval request, the metadata, slice names (e.g., based on the data object name and determined as described in FIG. 3) and may include the requirements summary 130. The DS processing sends the retrieval message to the target DS units 130. Note that the DS processing may send the retrieval message to the target DS units by way of one or more of a broadcast (e.g., all DS units), a unicast (e.g., one DS unit at a time), and/or a multicast (e.g., to a subset of DS units organized into a subset) transmission.

The DS processing receives a retrieval response from one or more DS units where the retrieval response includes slices. The method of the DS unit determination of the retrieval response is discussed in greater detail with reference to FIG. 9.

The DS processing determines if sufficient responses have been received that in totality include enough slices to create a data segment or a series of data segments to create the data object 132. Note that the DS processing may be in a sequence to retrieve one slice, a batch of data segment slices for the same pillar, more than one batch of data segment slices for one or more pillars, up to all slices for each data segment of the data object. In other words, the DS processing is looking for a sufficient number of slices to create the slice, data segment, and/or data object. For example, the DS processing may be looking for a read threshold k number of slices to recreate a data segment. Note that the DS processing may determine the read threshold by a lookup in the user vault for this user ID.

The DS processing determines if a timeout has occurred when the DS processing determines that sufficient favorable responses has not been received so far 134. The timeout time period may start when the DS processing sent the retrieval message. The method branches back to the step where the DS processing receives responses and determines if sufficient favorable responses have been received when the DS processing determines that the timeout has not occurred 132. The method branches back to the step where the DS processing determines the target DS units when the DS processing determines that the timeout has occurred 128. Note that the DS processing may try other DS units that were not sent the retrieval solicitation so far. Further note that the method may continue in this loop for several iterations and in another embodiment, the DS processing may retry DS units that have been sent the retrieval solicitation message (e.g., the DS unit status may have changed).

The DS processing determines the operational parameters (e.g., discussed with reference to FIG. 3) based on one or more of, but not limited to the metadata, the number of favorably responding DS units, the DS unit capability indicator, a command, a predetermination, and/or a user vault lookup when the DS processing determines that sufficient favorable responses have been received 136. For example, the DS processing may retrieve the storage set information from the user vault. In another example, the DS processing may retrieve multiple storage sets from the user vault such that the slices of different data segments were sent to different storage sets.

In another embodiment, the DS processing performs slice retrievals by looking up in memory where the slices are stored when the DS processing previously saved the DS unit choices.

The DS processing de-slices and decodes the retrieved slices of the data object to recreate the data segment(s) in accordance with the operational parameters 138. The DS processing recreates the data object by recreating the data segments. Note that the method described above may loop until all of the data segments are available to form the data object. The DS processing sends the data object to the requester 138.

Figure 9:
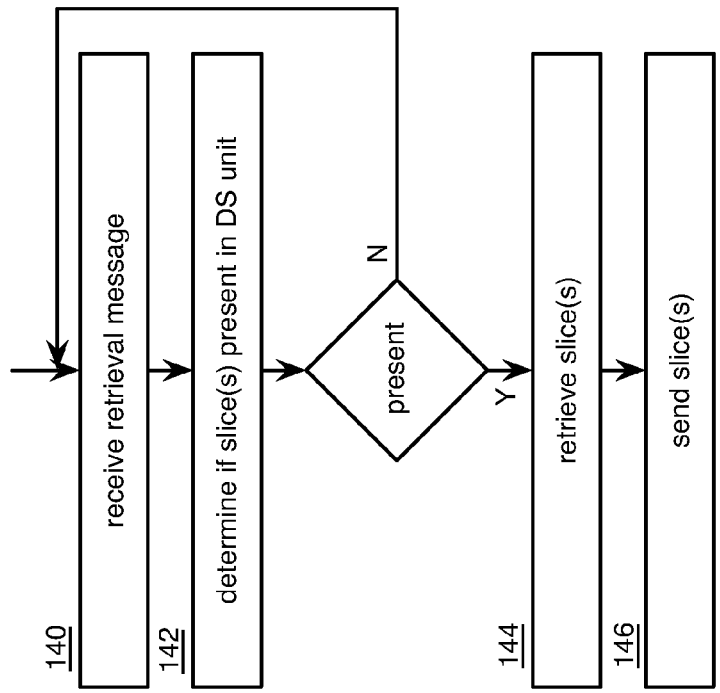
FIG. 9 is a flowchart illustrating the response to a solicitation to retrieve slices in accordance with the invention.

FIG. 9 is a flowchart illustrating the response to a solicitation to retrieve slices where the DS unit determines how to respond to receiving a retrieval message from the DS processing.

The method begins with the DS unit receiving the retrieval message from the DS processing 140. The retrieval message may include the retrieval command, the metadata, the slice names, and/or the data object name.

The DS unit determines if the slices are present based on one or more of a lookup in a local virtual DSN address to physical location table, the metadata, DS unit status, DS unit memory availability, a command, a predetermination, historic DS unit performance, and/or DS unit loading 142. For example, the DS unit compares the slice names from the retrieval message to the slice names in the local virtual DSN address to physical location table to look for a match (e.g., present). The method branches back to the step of the DS unit receiving the retrieval message when the DS unit determines that the slice(s) are not present 140. In another embodiment, the DS unit sends a retrieval response message to the DS processing that indicates that the slice is not present.

The DS unit retrieves the slice(s) when the DS unit determines that the slice(s) are present 144. The DS unit may determine where to retrieve the slice(s) from by looking up the location in the local virtual DSN address to physical location table. In an embodiment, the slices are stored in the present DS unit. In another embodiment, the slices are stored in at least one other DS unit.

The DS unit sends the retrieval response to the DS processing that sent the solicitation 146. The retrieval response may include the slice(s). In another embodiment, the DS unit may or may not contain a portion of the slices where at least a portion of the slices were sent in the store sequence to at least one other DS unit for storage. A method to determine retrieval of forwarded slices is discussed in greater detail with reference to FIGS. 12-13 and 15.

Figure 10:
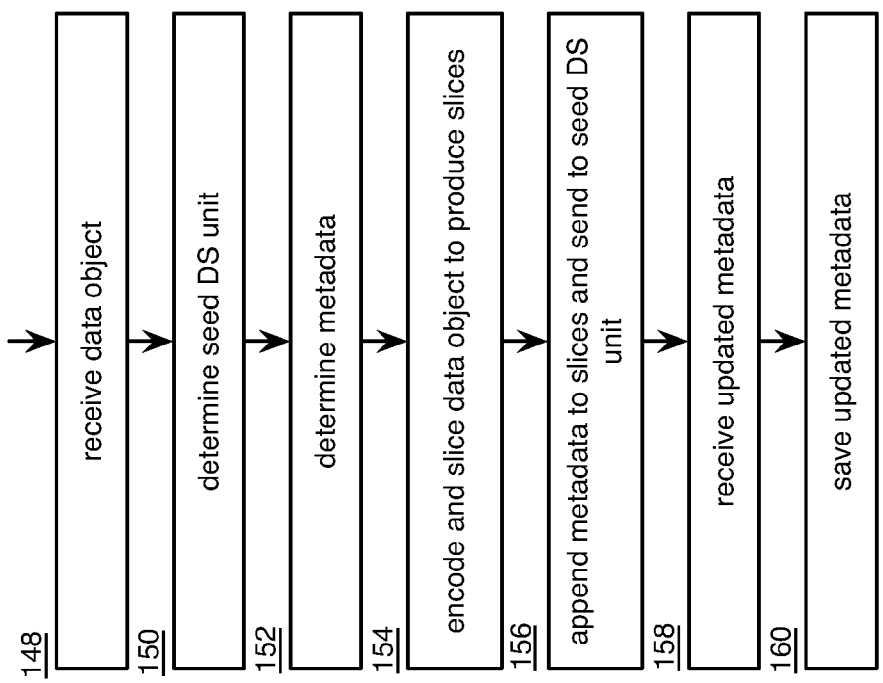
FIG. 10 is another flowchart illustrating the storing of slices in accordance with the invention.

FIG. 10 is another flowchart illustrating the storing of slices where the DS processing initiates the storing of slices to a plurality of DS units in a serial fashion as described in the method below. In other words, the DS processing sends a batch of slices to just one initial DS unit that may store at least some of the slices and then forwards the remaining un-stored slices to another DS unit to repeat the process until all the slices are stored.

The method begins with the step of the DS processing receiving a data object to store (e.g., from a user device) 148. The DS processing may receive the user ID, the data object name, and metadata associated with the data object.

The DS processing determines a seed DS unit where the DS processing will send the initial batch of slices 150. The determination may be based on one or more of, but is not limited to a random choice, the metadata, a DS unit list, geographic locations of DS units, geographic location of the user device, a command, a predetermination, a DSN memory status indicator, a DS unit history indicator, and/or a DSN memory performance indicator. For example, the DS processing may select the seed DS unit that is geographically close to the user device and has a history of sufficient reliability and performance.

The DS processing determines metadata where the metadata may include one or more of, but is not limited to a hash of the data object, a priority requirement, a security requirement, a performance requirement, a size indicator, a data type indicator, a location requirement, and/or a user ID 152. The determination may be based on one or more of the received metadata, the user ID, the data object name, a data type indicator, the data object, a calculated hash of the data object, a priority indicator, a security indicator, a performance requirement, a command, a user vault lookup, geographic location of the user device, a location requirement, and/or a predetermination.

The DS processing determines the operational parameters (e.g., discussed with reference to FIG. 3, and to include the seed DS unit choice as the first element of a trail) based on one or more of, but not limited to the metadata, a capability indicator of the seed DS unit, a command, a predetermination, and/or a user vault lookup. For example, the DS processing may choose the pillar width n to be much larger than the read threshold k for storing a data segment in a storage set when utilizing this method. In another example, the DS processing may choose multiple storage sets comprising one or more seed DS units such that the slices of different data segments may be sent to different storage sets (e.g., resulting in different trails). The DS processing may include the storage set choices (e.g., pillar width n and the seed DS unit ID) in the operational parameters.

The DS processing may save the operational parameters in the user vault, in the metadata, and/or another memory. The DS processing may or may not save the seed DS unit choices (e.g., per slice name and/or data segment ID) in the user vault, a virtual DSN address (e.g., slice name) to physical location table, and/or another memory. In one embodiment, the DS processing performs subsequent slice retrievals through another method when the DS processing does not save the seed DS unit choices. In another embodiment, the DS processing performs subsequent slice retrievals by looking up in memory where the slices are stored when the DS processing saves the seed DS unit choices. The retrieval method is discussed in greater detail with reference to FIGS. 12-13.

The DS processing encodes and slices the data object to produce the slices in accordance with the operational parameters 154. The DS processing appends the metadata to the slices and sends the slices to the seed DS unit with a store command for subsequent storage in the DS units in accordance with the operational parameters 156. Note that the DS processing may send one slice, all the slices batched for a pillar of a data segment, all the slices of a data segment, all the slices of all the data segments of the data object. The method may branch back to the step where the DS processing determines the seed DS unit when the DS processing is not finished creating and sending slices for the data object. For example, the steps described above may repeat for the next data segment.

The DS processing may subsequently receive updated metadata from at least one DS unit along the storage trail where the updated metadata includes the DS unit ID of DS units along the storage trail 158. In other words, the trail may indicate which DS units stored which portions (e.g., slice names) of the slices. The DS processing may save the updated metadata in one or more of the user vault, a virtual DSN address (e.g., slice name) to physical location table, and/or another memory 160.

Note that in an embodiment the slices may be retrieved in a serial fashion starting with slices stored at the seed DS unit. Further note that the operational parameters may be optimized to facilitate faster data segment decoding by including data bits of the data object in a first grouping of the slices and including parity/error correction bits in a second grouping of the slices. In this fashion the first slices retrieved may contain everything to decode the data segment (e.g., when there are no errors) without retrieving further slices.

Figure 11:
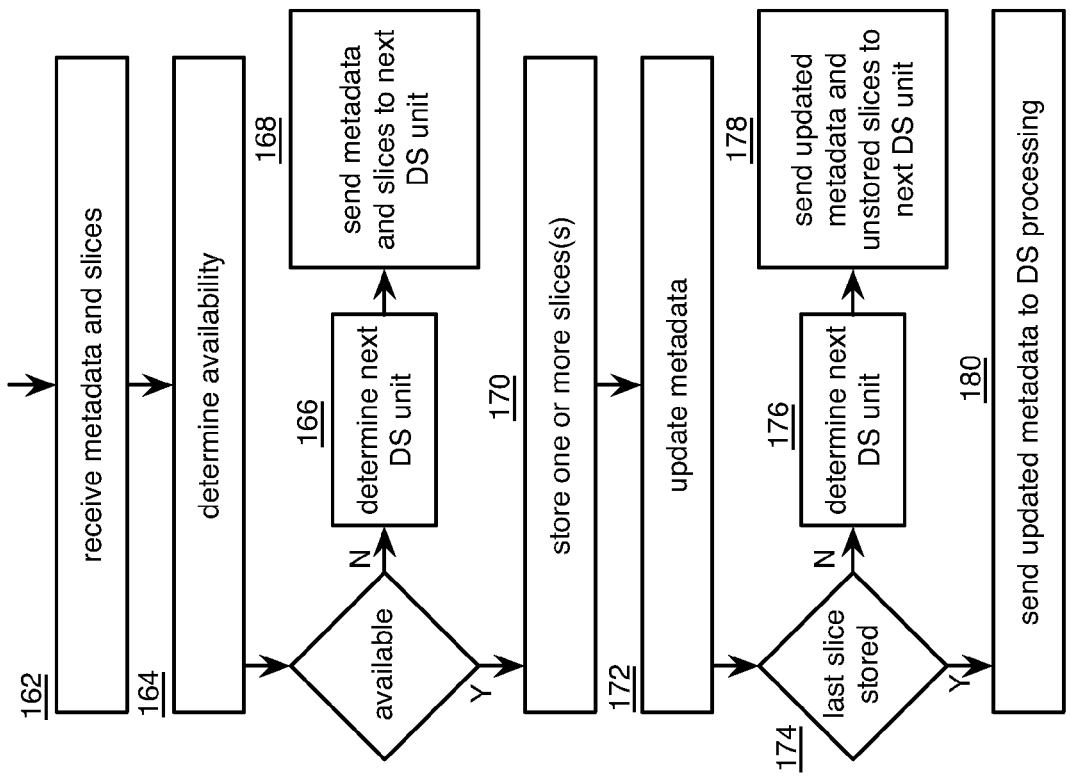
FIG. 11 is another flowchart illustrating the storing of slices in accordance with the invention.

FIG. 11 is another flowchart illustrating the response to a solicitation to store slices where the DS unit determines how to respond to receiving slices to store from the DS processing.

The method begins with the DS unit receiving the store command, slices, slice names, and metadata from the DS processing or from another DS unit when the present DS unit is not the seed DS unit in the trail 162. Note that the slices may comprise slices of one or more data segments and one or more pillars.

The DS unit determines its availability based on one or more of the metadata, DS unit status, DS unit memory availability, a command, a predetermination, historic DS unit performance, and/or DS unit loading 164. For example, the DS unit compares the memory requirements from the metadata to the memory availability and determines that the DS unit is available for this solicitation when the amount of available memory is greater than the memory requirements (e.g., to store at least a portion of the slices).

The DS unit determines a next DS unit when the DS unit determines that the DS unit is not available 166. In another embodiment, the DS unit sends a storage response message to the DS processing that includes a not available indicator (e.g., so the process may avoid this DS unit at least for a time period). The DS unit determines the next DS unit based on one or more of, but is not limited to the trail in the metadata, a routing table entry in a router connecting DS unit functions, a random choice, the metadata, a DS unit list, geographic locations of DS units, geographic location of the user device, a command, a predetermination, a DSN memory status indicator, a DS unit history indicator, and/or a DSN memory performance indicator. For example, the DS unit may select the next DS unit that is geographically close to the current DS unit (e.g., as indicated by the routing table), has a history of sufficient reliability and performance, and is not in the trail yet. The DS unit sends the store command, slices, slice names, and metadata to the next DS unit 168.

The DS unit stores one or more slices to its local memory and may update the local virtual DSN memory to physical location table when the DS unit determines that the DS unit is available 170. Note that the DS unit may only store as much as it determines it can store (e.g., based on available memory and the amount requested). Further note that the DS unit may only store slices of the same pillar number to improve system reliability.

The DS unit updates the metadata adding the DS unit ID to produce updated metadata (e.g., updated trail) 172. The DS unit may save the updated metadata locally.

The DS unit determines if the last slice has been stored by inspecting the slice batch and what was just stored locally 174. The DS unit determines a next DS unit when the DS unit determines that the last slice has not been stored 176. The DS unit determines the next DS unit based on one or more of, but is not limited to the trail in the metadata, a routing table entry in a router connecting DS unit functions, a random choice, the metadata, a DS unit list, geographic locations of DS units, geographic location of the user device, a command, a predetermination, a DSN memory status indicator, a DS unit history indicator, and/or a DSN memory performance indicator. For example, the DS unit may select the next DS unit that is geographically close to the current DS unit (e.g., as indicated by the routing table), has a history of sufficient reliability and performance, and is not in the trail yet. The DS unit sends the store command, slices, slice names, and the updated metadata to the next DS unit 178. In another embodiment, the DS unit sends the updated metadata to the DS processing.

The DS unit sends the updated metadata to the DS processing when the DS unit determines that the last slice has been stored (e.g., the final trail) 180. In an embodiment, the DS unit may temporarily cache one up to all of the received slices and look for confirmation from the DS processing unit or another DS unit that all of the slices have been stored as described above before deleting the cached slices.

Figure 12:
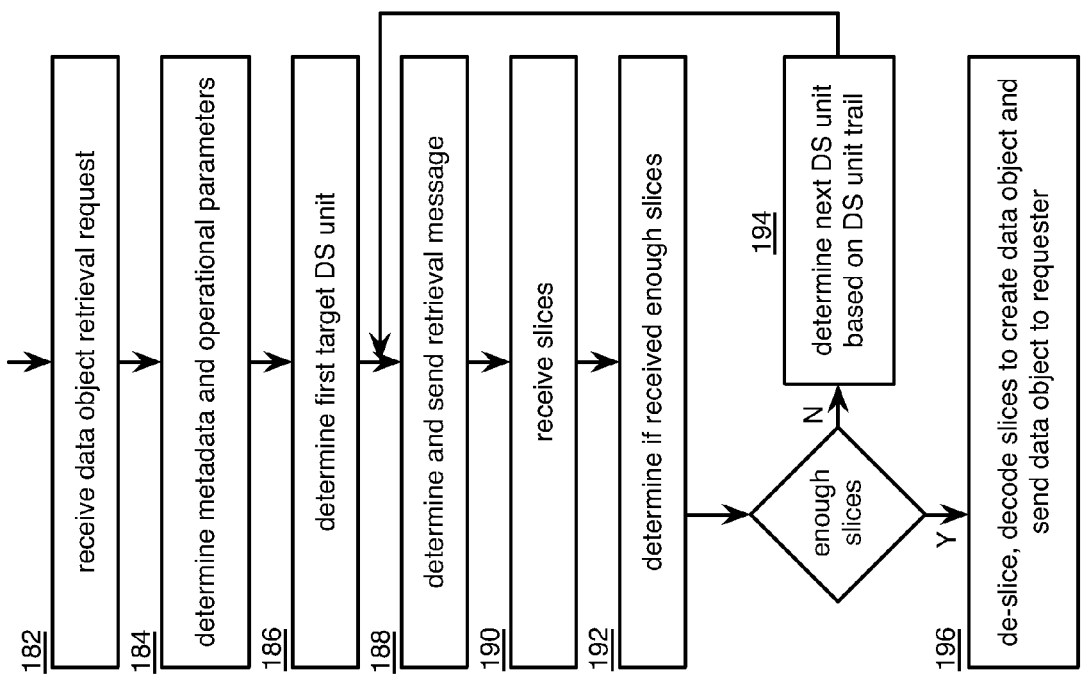
FIG. 12 is another flowchart illustrating the retrieving of slices in accordance with the invention.

FIG. 12 is another flowchart illustrating the retrieving of slices where the DS processing determines a first target DS unit to start with to serially retrieve slices DS unit by DS unit by way of a retrieval method described below.

The method begins with the step of the DS processing receiving a request to retrieve a data object (e.g., from a user device) 182. The DS processing may receive the user ID, the data object name, and metadata associated with the data object.

The DS processing determines metadata where the metadata may include one or more of, but is not limited to a hash of the data object, a priority requirement, a security requirement, a performance requirement, a size indicator, a data type indicator, a location requirement, and/or a user ID 184. The determination may be based on one or more of the received metadata, the user ID, the data object name, a data type indicator, a previously calculated hash of the data object, a priority indicator, a security indicator, a performance requirement, a command, a user vault lookup, geographic location of the user device, a location requirement, and/or a predetermination.

The DS processing determines the operational parameters (e.g., discussed with reference to FIG. 3) based on one or more of, but not limited to the metadata, a DS unit capability indicator, a command, a predetermination, and/or a user vault 184. For example, the DS processing may retrieve the operational parameters including the storage set information from the user vault. In another example, the DS processing may retrieve multiple storage sets from the user vault when the slices of different data segments were sent to different storage sets.

The DS processing determines a first target DS unit where the target DS unit represents the seed DS unit that the DS processing utilized previously to start the storage of slices 186. In other words, this is the DS units where the slices were most likely first stored. The determination may be based on one or more of, but is not limited to the metadata, a lookup in the user vault, a DS unit list, geographic locations of DS units, geographic location of the user device, a command, a predetermination, a DSN memory status indicator, a DS unit response history indicator, and/or a DSN memory performance indicator. The DS processing may select the first target DS unit that is estimated to at least meet the requirements indicated by the metadata and may meet other requirements imposed by a command or a predetermination. For example, the DS processing may choose the first target DS units with estimated sufficient memory, that has not been chosen yet for this sequence, and that are within a five mile radius of geographic proximity to the user device to provide enhanced performance.

The DS processing determines a retrieval message for the first target DS unit that includes a retrieval request, the metadata, and the slice names (e.g., based on the data object name and determined as described in FIG. 3 188. The DS processing sends the retrieval message to the first target DS unit 188. Note that the DS processing may determine more than one first target when more than one storage set is utilized. Further note that the DS processing may send the retrieval message to the first target DS unit(s) by way of one or more of a broadcast (e.g., all DS units), a unicast (e.g., one DS unit at a time), and/or a multicast (e.g., to a subset of DS units organized into a subset) transmission.

The DS processing receives a retrieval response from one or more DS units where the retrieval response includes slices 190. The method of the DS unit determination of the retrieval response is discussed in greater detail with reference to FIG. 13.

The DS processing determines if enough slices have been received from the retrieval responses to create a data segment or a series of data segments to create the data object 192. Note that the DS processing may be in a sequence to retrieve one slice, a batch of data segment slices for the same pillar, more than one batch of data segment slices for one or more pillars, up to all slices for each data segment of the data object. In other words, the DS processing is looking for a sufficient number of slices to create the slice, data segment, and/or data object. For example, the DS processing may be looking for a read threshold k number of slices to recreate a data segment. Note that the DS processing may determine the read threshold from the operational parameters (e.g., by a lookup in the user vault for this user ID).

The DS processing determines the next DS unit when the DS processing determines that enough slices have not been received so far 194. The DS processing may determine the next DS unit based on the DS unit trail in the metadata (e.g., a linked list of one DS unit to the next where the slices were previously stored). The method branches back to the step where the DS processing determines and sends the retrieval message (e.g., this time from the next DS unit) 188. Note that the method may continue in this loop for several iterations and in another embodiment, the DS processing may retry DS units that have been sent the retrieval message (e.g., the DS unit may have been off line).

In another embodiment, the DS processing performs slice retrievals by looking up in memory where the slices are stored when the DS processing previously saved the DS unit choices.

The DS processing de-slices and decodes the retrieved slices of the data object to recreate the data segment(s) in accordance with the operational parameters when the DS processing determines that enough slices have been received 196. The DS processing recreates the data object by recreating the data segments. Note that the method described above may loop until all of the data segments are available to form the data object. The DS processing sends the data object to the requester.

Figure 13:
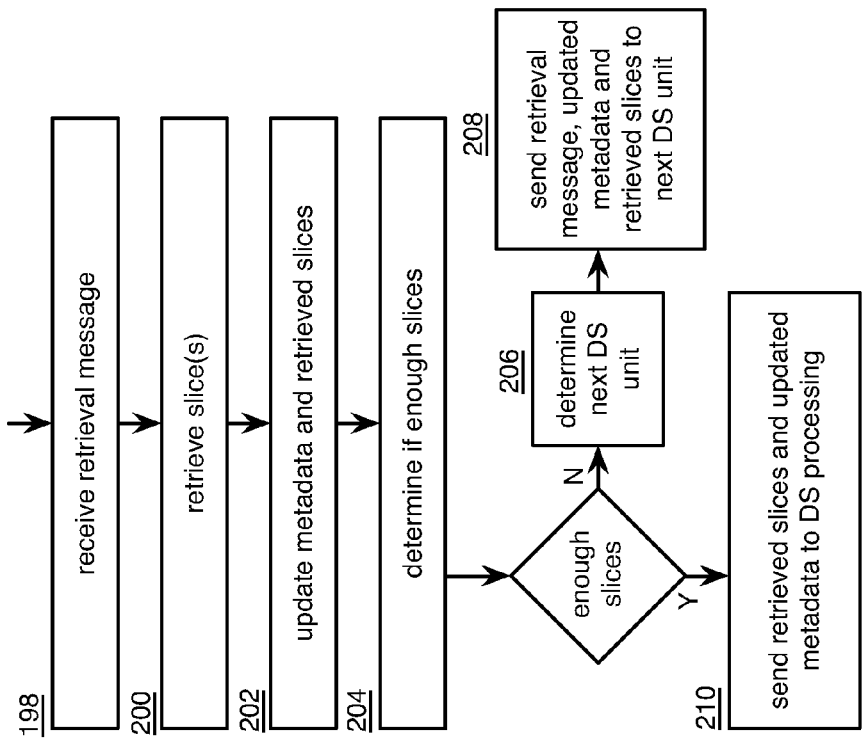
FIG. 13 is another flowchart illustrating the retrieving of slices in accordance with the invention.

FIG. 13 is another flowchart illustrating the retrieving of slices where the DS unit determines how to respond to receiving a retrieval message from the DS processing or another DS unit when the slices may be stored serially at different DS units.

The method begins with the DS unit receiving the retrieval message 198. The retrieval message may include the retrieval command, the metadata, a pool of slices retrieved so far (e.g., from other DS units on the same trail), the slice names, and/or the data object name.

The DS unit determines if the slices are present based on one or more of a lookup in a local virtual DSN address to physical location table, the metadata, DS unit status, DS unit memory availability, a command, a predetermination, historic DS unit performance, and/or DS unit loading. For example, the DS unit compares the slice names from the retrieval message to the slice names in the local virtual DSN address to physical location table to look for a match (e.g., present). The method branches back to the step of the DS unit receiving the retrieval message when the DS unit determines that the slice(s) are not present. In another embodiment, the DS unit sends a retrieval response message to the DS processing that indicates that the slice is not present.

The DS unit retrieves the slice(s) 200 and updates the retrieved slices pool (e.g., the aggregation of all the slices retrieved so far along the DS unit storage trail) when the DS unit determines that the slice(s) are present 202. The DS unit may determine where to retrieve the slice(s) from by looking up the location in the local virtual DSN address to physical location table. In an embodiment, the slices are stored in the present DS unit. In another embodiment, the slices are stored in at least one other DS unit.

The DS unit updates the metadata with the DS unit ID to produce updated metadata 202. Note that the metadata now indicates that the slice pool includes slices retrieved from the present DS unit.

The DS unit determines if enough slices have been retrieved when either the DS unit determines that all of the possible slices have been retrieved from the DS unit storage trail or if the DS unit determines that the slice pool now contains at least a read threshold number of slices (e.g., the read threshold from the metadata) 204. When enough slices have not been retrieved, the DS unit determines the next DS unit based on the DS unit storage trail in the metadata 206. The DS unit sends the retrieval message to the next DS unit where the retrieval message includes the retrieval command, the updated metadata, the pool of retrieved slices so far (e.g., from other DS units on the same trail), the slice names, and/or the data object name 208. The next DS unit may append more slices to the slice pool until either all the slices have been retrieved or if a read threshold number of slices has been retrieved as previously described.

When enough slices have been retrieved, the DS unit sends the retrieval message (e.g., including the retrieved slice pool and updated metadata) to the DS processing that sent the retrieval request such that the DS processing can decode the slices as discussed previously 210.

Figure 14:
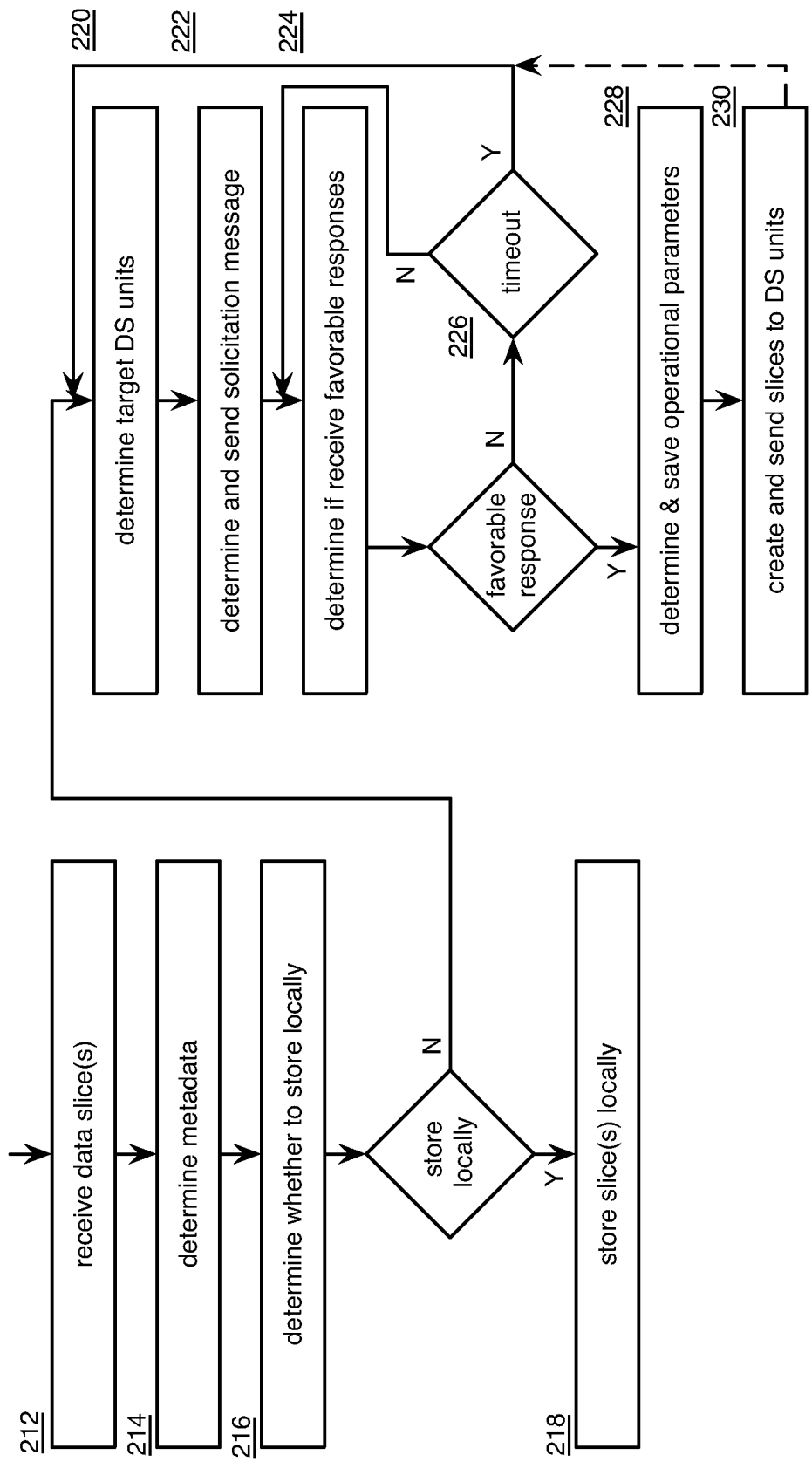
FIG. 14 is another flowchart illustrating the storing of slices in accordance with the invention.

FIG. 14 is another flowchart illustrating the storing of slices where the DS unit coordinates the determination of other DS units to store slices to by way of a solicitation method described below. In other words, the DS unit receives slices and requests that the other DS units determine their participation in storing data rather than the DS unit storing all the slices.

The method begins with the step of the DS unit receiving data slices to store (e.g., from the DS processing) 212. In an embodiment, a plurality of slices is received. In another embodiment, one slice is received. Note that the DS unit may receive the slices, the slice names, the DS processing unit ID, the user ID, the data object name, and metadata associated with the data object.

The DS unit determines metadata where the metadata may include one or more of, but is not limited to a hash of the data object, a hash of the slices, a priority requirement, a security requirement, a performance requirement, a data object size indicator, a data segment size indicator, a slice size indicator, a data type indicator, a location requirement, and/or a user ID 214. The determination may be based on one or more of the received metadata, the user ID, the data object name, the slice names, the slices, a data type indicator, the data object, a calculated hash of the data object, a calculated hash of the data segment, a calculated hash of the slice, a priority indicator, a security indicator, a performance requirement, a command, a user vault lookup, geographic location of the user device, a location requirement, and/or a predetermination.

The DS unit determines whether to store at least a portion of the slices locally based on one or more of the metadata, DS unit status, DS unit memory availability, a command, a predetermination, historic DS unit performance, and/or DS unit loading 216. For example, the DS unit compares the memory requirements from the metadata to the memory availability and determines that the DS unit can store slices locally when the amount of available memory is greater than the memory requirements. The method branches to the step of the DS unit determining target DS units to solicit for help when the DS unit determines that the DS unit cannot store any of the slices locally 220.

In an embodiment, the DS unit stores at least some of the slices locally when the DS unit determines that the DS unit can store at least some of the slices locally 218. In another embodiment, the method branches to the step of the DS unit determining target DS units to solicit for help when the DS unit stores less than all of the received slices.

The DS unit determines target DS units where the target DS units represent DS units that the DS unit will subsequently solicit to store slices 220. The determination may be based on one or more of, but is not limited to the metadata, a DS unit list, geographic locations of DS units, geographic location of the user device and/or DS processing unit, a command, a predetermination, a DSN memory status indicator, a DS unit solicitation response history indicator, and/or a DSN memory performance indicator. The DS unit may select target DS units that are estimated to at least meet the requirements indicated by the metadata and may meet other requirements imposed by a command or a predetermination. For example, the DS unit may target DS units with estimated sufficient memory, that have not been solicited yet for this sequence, and that are within a five mile radius of geographic proximity to the DS processing unit to provide enhanced performance.

The DS unit determines a solicitation message for the target DS units that includes a solicitation request, the metadata, and may include a requirements summary 222. The DS unit sends the solicitation message to the target DS units 222. Note that the DS unit may send the solicitation message to the target DS units by way of one or more of a broadcast (e.g., all DS units), a unicast (e.g., one DS unit at a time), and/or a multicast (e.g., to a subset of DS units organized into a subset) transmission.

The DS unit receives a solicitation response from one or more DS units where the solicitation response includes a favorable or unfavorable indicator. The response may also include a DS unit capability indicator (e.g., how much memory is available, a performance indicator, etc). A favorable indicator indicates that the DS unit is willing to store slices and an unfavorable indicator indicates that the DS unit is not willing to store slices. In another embodiment, the DS unit may only send a solicitation response that includes the favorable indicator (e.g., it does not send a response with the unfavorable indicator). The method of the DS unit determination of the solicitation response was discussed previously in greater detail with reference to FIG. 7.

The DS unit determines if sufficient responses have been received that include the favorable indicator and that will meet the requirements of a sequence 224. Note that the DS unit may be in a sequence to store one slice, a batch of data segment slices for one same pillar, more than one batch of data segment slices for one or more pillars, up to all slices for each data segment of the data object. In other words, the DS unit is looking for a sufficient number DS units that will meet the sequence needs and meet the functional and performance requirements based on the metadata.

The DS unit determines if a timeout has occurred when the DS unit determines that sufficient favorable responses has not been received so far 226. The timeout time period may start when the DS unit sent the solicitation message. The method branches back to the step where the DS unit receives responses and determines if sufficient favorable responses have been received when the DS unit determines that the timeout has not occurred 224. The method branches back to the step where the DS unit determines the target DS units when the DS unit determines that the timeout has occurred 220. Note that the DS unit may try other DS units that were not sent the solicitation method so far. Further note that the method may continue in this loop for several iterations and in another embodiment, the DS unit may retry DS units that have been sent the solicitation message (e.g., the solicited DS unit status may have changed).

The DS unit determines the operational parameters (e.g., discussed with reference to FIG. 3, and to include the DS unit choices) based on one or more of, but not limited to the metadata, the number of favorably responding DS units, the DS unit capability indicator, a command, a predetermination, and/or a user vault lookup when the DS unit determines that sufficient favorable responses have been received 228. For example, the DS unit may choose the pillar width n to be less than the number of favorably responding DS units and much larger than the read threshold k for storing a data segment in a storage set when utilizing this solicitation method. In another example, the DS unit may choose multiple storage sets comprising the favorably responding DS units such that the slices of different data segments may be sent to different storage sets. The DS unit may include the storage set choices in the operational parameters.

The DS unit may save the operational parameters in the user vault and/or another memory 228. The DS unit may or may not save the DS unit choices (e.g., per slice name) in the user vault, a virtual DSN address (e.g., slice name) to physical location table, and/or another memory. In one embodiment, the DS unit performs subsequent slice retrievals through another solicitation method when the DS unit does not save the solicited DS unit choices. In another embodiment, the DS unit performs subsequent slice retrievals by looking up in memory where the slices are stored when the DS unit saves the solicited DS unit choices. The retrieval method is discussed in greater detail with reference to FIG. 15.

In an embodiment, the DS unit encodes and slices the received slices to create further slices for distribution in accordance with the operational parameters 230. In another embodiment, the DS unit passes the received slices directly to the chosen solicited DS units. The DS unit sends the slices to the chosen solicited DS units with a store command for subsequent storage in the chosen solicited DS units in accordance with the operational parameters 230. Note that the DS unit may send one slice, all the slices batched for a pillar of a data segment, all the slices of a data segment, all the slices of all the data segments of the data object. The method may branch back to the step where the DS unit determines target DS units when the DS unit is not finished creating and sending slices for the data object 220. For example, the loop described above may repeat for the next data segment.

Figure 15:
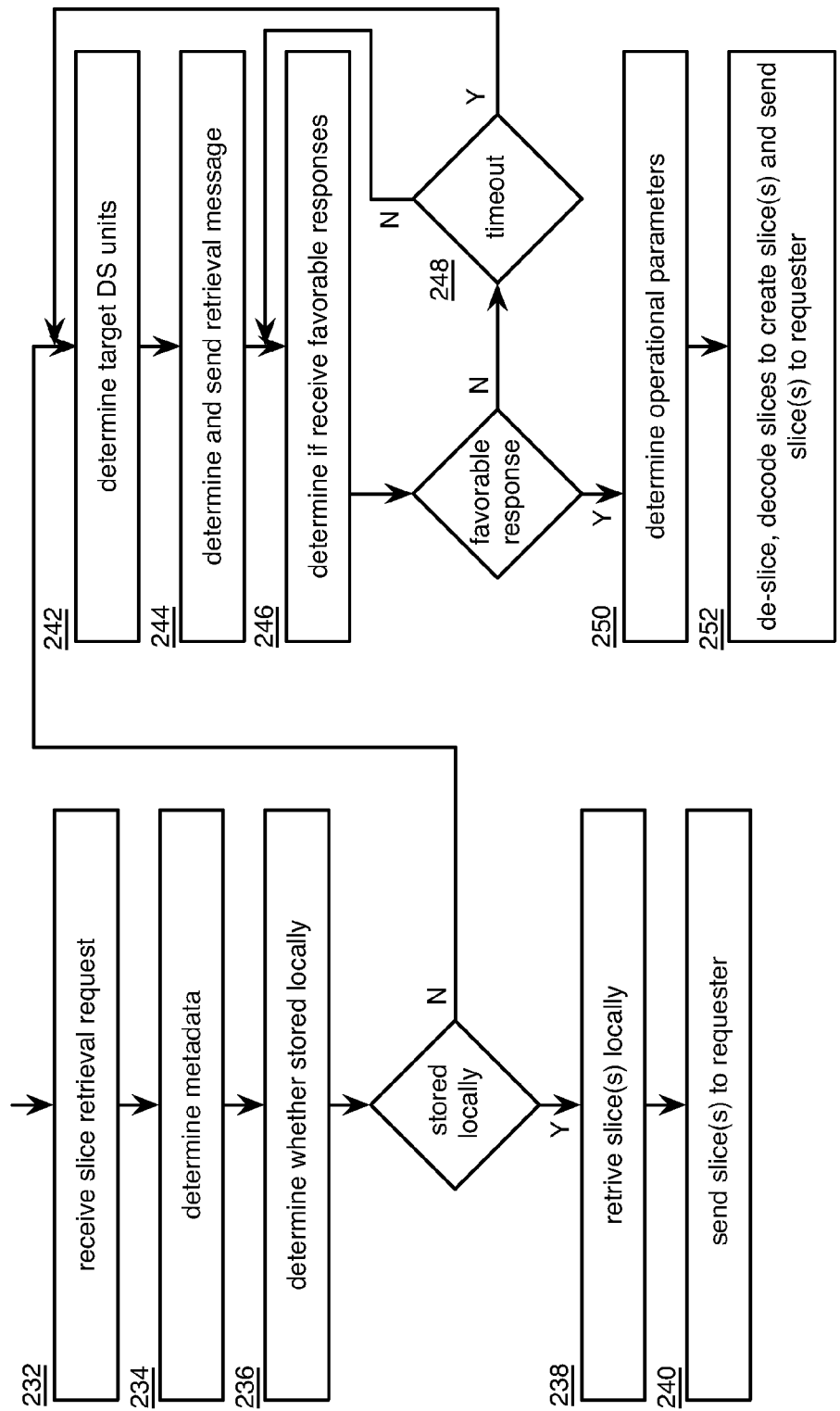
FIG. 15 is another flowchart illustrating the retrieving of slices in accordance with the invention.

FIG. 15 is another flowchart illustrating the retrieving of slices where the DS unit determines which other DS units to try to retrieve slices from by way of a retrieval solicitation method described below. In other words, the DS unit requests that the other DS units that are likely to contain desired slices send them to the DS unit rather than the DS unit requesting slices from particular other DS units that are known to contain the desired slices.

The method begins with the step of the DS unit receiving a request to retrieve slices (e.g., from a DS processing) 232. Note that the request may be for one or more slices. The DS unit may receive the slice names, the DS processing ID, the user ID, the data object name, and metadata associated with the data object.

The DS unit determines metadata where the metadata may include one or more of, but is not limited to slice names, a hash of the data object, a hash of the slices, a priority requirement, a security requirement, a performance requirement, a size indicator, a data type indicator, a location requirement, and/or a user ID 234. The determination may be based on one or more of the received metadata, the user ID, the DS processing ID, the data object name, a data type indicator, a previously calculated hash of the data object, a previously calculated hash of data segments, a priority indicator, a security indicator, a performance requirement, a command, a user vault lookup, geographic location of the user device, a location requirement, and/or a predetermination.

The DS unit determines whether the slices are stored locally on the present DS unit based on one or more of a lookup in a local virtual DSN address to physical location table, the metadata, DS unit status, DS unit memory availability, a command, a predetermination, historic DS unit performance, and/or DS unit loading 236. For example, the DS unit compares the slice names from the retrieval request to the slice names in the local virtual DSN address to physical location table to look for a match (e.g., stored locally). The method branches to the step of the DS unit determining the target DS units to solicit for retrieval when the DS unit determines that none of the slice(s) are stored locally 242.

The DS unit retrieves the slice(s) locally when the DS unit determines that at least some of the slice(s) are stored locally 238. The DS unit may determine where to retrieve the slice(s) from by looking up the location in the local virtual DSN address to physical location table. In an embodiment, the slices are all stored in the present DS unit. In another embodiment, the method branches to the step of the DS unit determining the target DS units to solicit for retrieval when the DS unit determines that only some of the slices are stored locally. The DS unit sends the slices retrieved locally to the requester that sent the request 240. The retrieval response may include the slice(s).

The DS unit determines target DS units where the target DS units represent DS units that the DS unit will subsequently solicit to retrieve slices 242. In other words, these are the DS units where the slices are most likely stored. The determination may be based on one or more of, but is not limited to the metadata, a DS unit list, geographic locations of DS units, geographic location of the user device, a command, a predetermination, a DSN memory status indicator, a DS unit solicitation response history indicator, and/or a DSN memory performance indicator. The DS unit may select target DS units that are estimated to at least meet the requirements indicated by the metadata and may meet other requirements imposed by a command or a predetermination. For example, the DS processing may target DS units with estimated sufficient memory, that have not been solicited yet for this sequence, and that are within a five mile radius of geographic proximity to the user device to provide enhanced performance.

The DS unit determines a retrieval message for the target DS units that includes a retrieval request, the metadata, slice names, and may include the requirements summary 244. The DS unit sends the retrieval message to the target DS units 244. Note that the DS unit may send the retrieval message to the target DS units by way of one or more of a broadcast (e.g., all DS units), a unicast (e.g., one DS unit at a time), and/or a multicast (e.g., to a subset of DS units organized into a subset) transmission.

The DS unit receives a retrieval response from one or more DS units where the retrieval response includes slices. The method of the DS unit determination of the retrieval response was previously discussed in greater detail with reference to FIG. 9.

The DS unit determines if sufficient responses (e.g., received slices) have been received 246. In an embodiment, the DS unit determines that if the responses include enough slices to match the desired slices (e.g., a list). In another embodiment, the DS unit determines if enough slices have been received to recreate a data segment or a series of data segments to create the data object. Note that the DS unit may be in a sequence to retrieve one slice, a batch of data segment slices for the same pillar, more than one batch of data segment slices for one or more pillars, up to all slices for each data segment of the data object. In other words, the DS unit may be looking for a sufficient number of slices to recreate a slice, data segment, and/or data object. For example, the DS unit may be looking for a read threshold k number of slices to recreate a data segment. Note that the DS unit may determine the read threshold by a lookup in the user vault for this user ID.

The DS unit determines if a timeout has occurred when the DS unit determines that sufficient favorable responses have not been received so far 248. The timeout time period may start when the DS unit sent the retrieval message. The method branches back to the step where the DS unit receives responses and determines if sufficient favorable responses have been received when the DS unit determines that the timeout has not occurred 246. The method branches back to the step where the DS unit determines the target DS units when the DS unit determines that the timeout has occurred 242. Note that the DS unit may try other DS units that were not sent the retrieval solicitation so far. Further note that the method may continue in this loop for several iterations and in another embodiment, the DS unit may retry target DS units that have been sent the retrieval solicitation message (e.g., the DS unit status may have changed).

The DS unit determines the operational parameters (e.g., discussed with reference to FIG. 3) based on one or more of, but not limited to the metadata, the number of favorably responding DS units, the DS unit capability indicator, a command, a predetermination, and/or a user vault lookup when the DS unit determines that sufficient favorable responses have been received 250. For example, the DS unit may retrieve the storage set information from the user vault. In another example, the DS unit may retrieve multiple storage sets from the user vault such that the slices of different data segments were sent to different storage sets.

In another embodiment, the DS unit performs slice retrievals by looking up in memory where the slices are stored when the DS unit previously saved the targeted DS unit choices.

In an embodiment, the DS unit de-slices and decodes the retrieved slices to recreate the data segment(s) and slices in accordance with the operational parameters when slices were created from slices during the storage process as discussed previously with reference to FIG. 14 252. Note that the method described above may loop until all of the data segments are available to form the original slices. The DS processing sends the slices to the requester.

Figure 16:
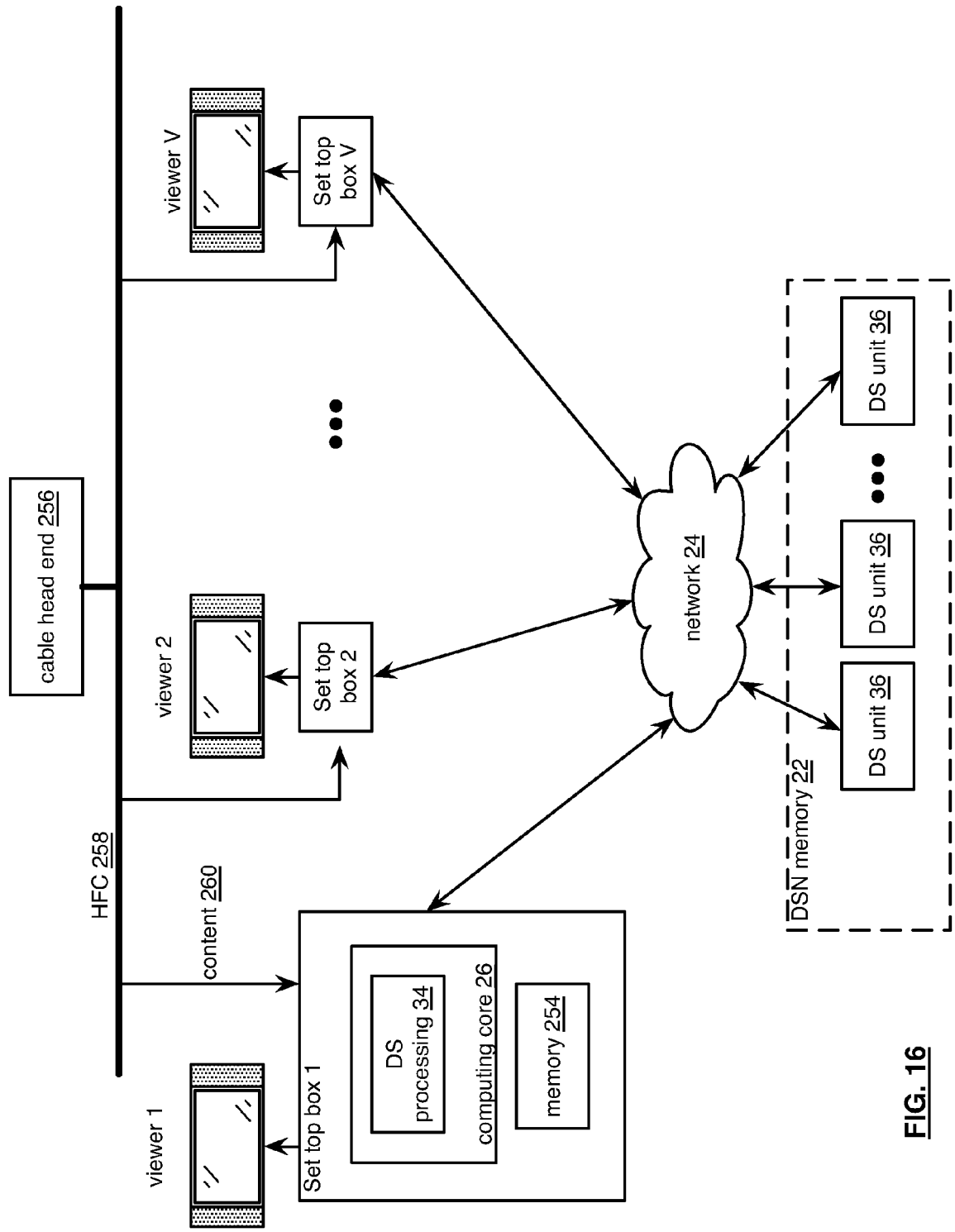
FIG. 16 is a schematic block diagram of an embodiment of a social television media storage system in accordance with the invention.

FIG. 16 is a schematic block diagram of an embodiment of a social television media storage system where viewers may invoke recording of cable television content on a set top box that may distributely store the content on other set top boxes and/or in the DSN memory 22.

The system includes a cable head end 256, a hybrid fiber coax (HFC) distribution 258, a plurality of viewers 1-V, a plurality of set top boxes 1-V, the network 24, and the DSN memory 22.

The cable head end 256 may source broadcast, multicast, and or unicast content 260 via the HFC distribution 258 to the plurality of set top boxes 1-V. In another embodiment, a satellite receiving system may substitute the cable head end 256 and/or HFC 258. In yet another embodiment, a content server (e.g., on the internet) and network 24 connection may substitute the cable head end 256 and/or HFC 258.

The set top box may comprise the computing core 26 of FIG. 2, a memory 254, and in an embodiment may include the DS processing 34 to transform media into slices for storage and retrieve slices, de-slice, and decode to produce media for viewing. The DS processing 34 may utilize the memory 254 to store content 260 including content 260 in the form of slices. The set top box may select content 260 from the cable head end 256 (e.g., broadcast/multicast or on-demand video over cable, satellite and/or the internet), stored content 260 from the memory 254, stored content 260 in other set top boxes, and/or content 260 from the DSN memory 22. Note that the set top box may function as a DS unit to store slices.

The viewer may reproduce the media (e.g., video, audio, pictures, web content) output from the set top box. For example, the viewer may comprise a flat panel television and may include a display and speakers to reproduce the media. In another embodiment, the functions of the set top box and viewer are integrated together. For example, the viewer may connect either directly to other viewers and/or the DSN memory 22 to store and retrieve media slices.

The set top box 256 determines which portion of the content 260 to store in memory 254. For example, the viewer and/or set top box may be operated to record or store in memory the 5:30 pm evening news on cable channel 188 on October 18 such that the viewer may subsequently access the content.

The set top box determines which content element (e.g. a portion of content 260 such as a particular show or program) stored in the memory 254 to distributedly store. The determination may be based on one or more of a command, a command from the cable head end 256, a command from at least one other set top box, a memory utilization indicator, and/or a predetermination. For example, the set top box determines to distributedly store a movie when the memory utilization indicator is above a threshold (e.g., indicating that the memory 254 is almost full).

The set top box determines the method to distributedly store and retrieve the content element where the method may include one or more of the methods discussed previously with reference to FIGS. 6-15. The determination may be based on one or more of a social group status indicator (e.g., availability of a group of set top boxes who share content 260 to store slices), a performance requirement, a command, a command from the cable head end 256, a command from at least one other set top box, a memory utilization indicator, and/or a predetermination. For example, the set top box may determine to utilize the solicitation method (e.g., discussed with reference to FIG. 6) where the target DS units 36 may be a social group comprising a subset of the set top boxes 1-V. In other words, the set top box determines to distribute slices of the content 260 element to other set top boxes of a social group. In another embodiment, the pool of target DS units 36 may include one or more layers of organization of set top boxes from the plurality of set top boxes 1-V. Note that another layer may include one or more of a different social group, a physical location (e.g., set top boxes in the same building, set top boxes in the same neighborhood, set top boxes in the same city, etc.). Further note that the set top box may determine to utilize one or more DS units 36 of the DSN memory 22.

Note that multiple set top boxes may determine to distributedly store the same content element. In an embodiment, the set top box determines if at least one other set top box in the social group of the set top box has previously distributedly stored the same content 260. The determination may be made based on one or more of a lookup in a table, querying a table in the other set top boxes of the same social group, querying a table in the user vault, querying a table in the DSN memory 22, searching the memory 254 in the other set top and/or boxes of the same social group.

In an embodiment, the set top box may update one or more tables (e.g., and not re-store slices of the same content element) when the set top box determines that at least one other set top box in the social group of the set top box has distributedly stored the same content 260. The set top box may update one or more tables, create EC data slices from the content element, and send the slices with a store command to the storage locations (e.g., determined by the method to distributedly store the content element) when the set top box determines that none of the other set top boxes in the social group of the set top box has distributedly stored the same content element. In another embodiment, the set top box may update one or more tables, create EC data slices from the content element, and send the slices with a store command to the storage locations (e.g., determined by the method to distributedly store the content element) when the set top box determines that at least one of the other set top boxes in the social group of the set top box has distributedly stored the same content element.

The set top box may retrieve slices of the content element, recreate the content element from the slices, and present the content element to the viewer. The set top box determines the method to distributedly retrieve the content element where the method may include one or more of the methods discussed previously with reference to FIGS. 6-15. The determination may be made as previously discussed. For example, the set top box may determine to utilize the solicitation method (e.g., discussed with reference to FIGS. 8-9) to retrieve slices where the target DS units 36 may be the social group comprising a subset of the set top boxes 1-V.

In an embodiment, the set top box retrieves content elements that the set top box previously stored distributedly (e.g., or any of the set top boxes invoked storing the content element) based on translating a content element ID (or accessing a DSN directory) into a virtual DSN address and retrieving the slices in accordance with the retrieval method based on the DSN address. In other words, the set top box can determine the list of content elements it has recorded.

In another embodiment, the set top box retrieves content elements that the set top box did not previously store distributedly (e.g., but at least one other of the set top boxes invoked storing the content element) based on translating a content element ID (or accessing a DSN directory of another set top box) into a virtual DSN address and retrieving the slices in accordance with the retrieval method based on the DSN address. In other words, the set top box can determine the list of content elements that other set top boxes (e.g., in the same social group as the set top box) have recorded. In this embodiment, set top boxes may share their DSN directories.

Figure 17:
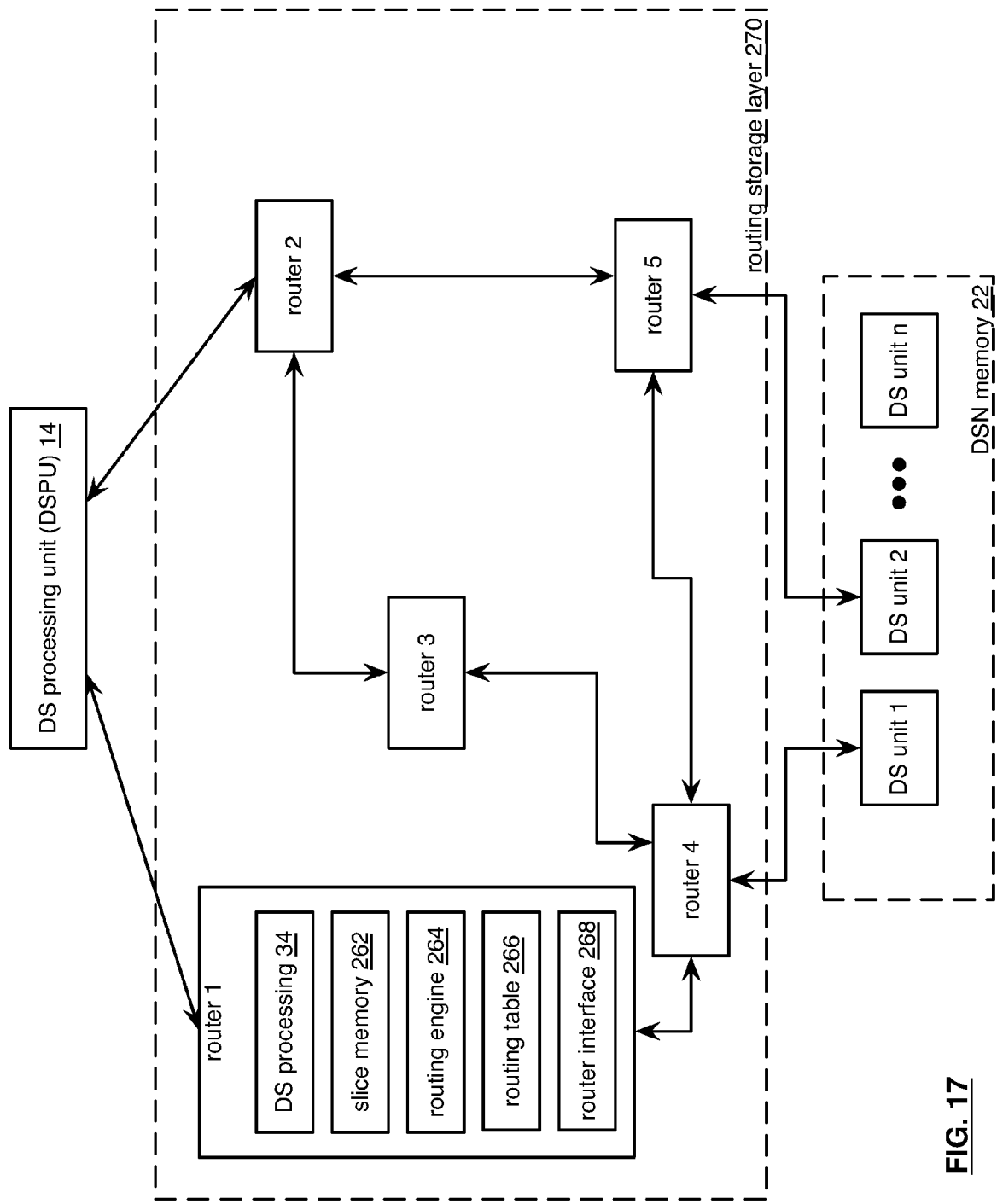
FIG. 17 is a schematic block diagram of an embodiment of a distributed storage system utilizing a routing storage layer in accordance with the invention.

FIG. 17 is a schematic block diagram of an embodiment of a distributed storage system utilizing a routing storage layer 270 where a DS processing unit 14 may store slices in the routing storage layer 270 and or the DSN memory 22.

The system includes the DS processing unit 14, a routing storage layer 270, and the DSN memory 22. The DSN memory 22 may comprise a plurality of DS units 1-n. The routing storage layer 270 comprises a plurality of any number of routers. In the example, the routing storage layer 270 includes routers 1-5 that operably couple the DS processing unit 14 to the DSN memory 22. Note that the routing storage layer 270 may comprise at least a portion of the network.

The router includes the DS processing 34, a slice memory 262, a routing engine 264, a routing table 266, and a router interface 268. The router may be fixed or portable and implemented utilizing the computer core of FIG. 2.

The router interface 268 couples other system elements to the router to receive and transmit data packets and may be wire lined or wireless. The router interface 268 may couple to any number of other routers or system elements.

The routing engine 264 receives received data packets via the router interface 268, processes the received data packets, communicates with the DS processing 34, utilizes the routing table 266, forms transmit data packets to be transmitted, and transmits the transmit data packets via the router interface 268.

The router may receive data packets from one system element and forward the data packets to another system element. For example, router 1 receives data packets targeting DS unit 1 from the DS processing unit 14 and forwards the data packets to the DS unit 1 through router 4. The router may receive data packets from one system element and forward the data packets through multiple other routers to another system element. For example, router 1 receives data packets targeting DS unit 2 from the DS processing unit 14 and forwards the data packets through router 4, through router 3, through router 2, and through router 5 to the DS unit 2. The routing engine 264 may determine how the router will process the received data packet and where the router will send the transmit data packets.

The routing engine 264 may determine the connections between routers and populate the routing table with entries to signify the connections between routers. The determination may be based on one or more of a predetermination, a command, and/or discovery. The routing engine 264 may perform the discovery by sending discovery messages via the router interface 268 and receiving responses via the router interface 268 noting which portion of the router interface 268 received which messages. The discovery message may include a router ID, a discovery command, and a performance indicator. The routing engine 264 may update the routing table contents from time to time as system topology may dynamically change. An example of a populated routing table is depicted in FIG. 18.

The routing engine 264 may determine where to forward slices to in the dispersed storage methods previously discussed with reference to FIGS. 10-13 based on the routing table 266. For example, the routing engine 264 may choose to forward slices down the path of router 2 to router 3 to router 4 based on the routing table 266 indicating those routers are linked in that order. Note that the system benefit may be less network traffic.

The router DS processing 34 may create slices from data or recreate data from slices and in an embodiment supports the distributed storage methods previously discussed with reference to FIGS. 14-15. The DS processing 34 may store slices in the slice memory 262 of the router or in the slice memory 262 of other routers. For example, router 1 may create and send slices to routers 3 and 5 based on receiving a slice from the DS processing unit 14 to further slice and store. Note that the router may function as a DS unit.

The DS processing unit 14 may determine routers to store and retrieve slices in accordance with a distributed storage method previously discussed with reference to FIGS. 6-15 and based in part on the routing table 266. For example, the DS processing unit 14 may determine to store slices in router 1 since the routing table reveals that router 1 is connected directly to the DS processing unit 14 and fast performance is favored. In another example, the DS processing unit 14 may determine to store slices in router 3 since the routing table 266 reveals that there are at least four routes between router 3 and the DS processing unit 14 and reliability is favored over speed. The DS processing unit 14 method of determining routers is discussed in greater detail with reference to FIGS. 18-19.

In an embodiment, the router DS processing 34 may determine to affiliate with one or more DS units in the DSN memory 22 or within another router to produce an affiliation. The determination may be based on one or more of a router status indicator, the routing table 266, and/or metadata associate with the slice. The routing engine 264 subsequently determines how to route and potentially store data in the router slice memory 262 slices based in part on the affiliation (e.g., store in the slice memory 262 in place of or in addition to the DS unit). For example, the router 4 DS processing 34 may determine to affiliate with DS unit 1 due to the direct connection. The router 5 DS processing 34 may determine to affiliate with DS unit 2 due to the direct connection. In an example of operation, the router 5 routing engine 264 may determine to cache slices intended for DS unit 2 in the router 5 slice memory 262. The router DS processing method of determining and utilizing DS unit affiliation is discussed in greater detail with reference to FIGS. 20-21.

FIG. 18 is an example table representing a routing table 266 for the topology of the example depicted in FIG. 17.

The routing table 266 includes entries for from nodes, to nodes, a route ID, a route priority, and a route. The route ID signifies a unique route between, from and to nodes through the nodes listed in the route field. The routing engine may determine the routes as previously discussed (e.g., via sending and receiving discovery messages). Each route permutation is listed as a unique route.

The routing engine may determine the route priority in a step subsequent to discovering all of the possible routes by rating the permutations of routes sharing the same from and to nodes with respect to each other. The example in FIG. 18 indicates one such rating scheme based on estimated latency performance (e.g., to minimize time delays through the routing storage layer by minimizing the hops through different nodes). For example, route 3 of the DSPU to DS unit 1 route has a route priority of 1 since it has the fewest number of nodes along the route as compared to routes 1 and 2.

In another embodiment, the routing engine may determine more entry columns to depict other facets including the estimated or measured performance of the links between the nodes to enable further refinement of performance based decisions. Note that the performance entry may depict latency, speed, capacity, error rates, etc.

Note that additional entries may be added to the routing table 266 to depict all the routes between every two elements and nodes of the system. The routing table 266 may be utilized in part by the DS processing unit, router DS processing, and/or the routing engine to determine how to route data packets, where to store slices, where to retrieve slices, where to forward slices, and how to establish affiliations. Determination methods will be discussed in greater detail with reference to FIGS. 19-21.

Figure 19:
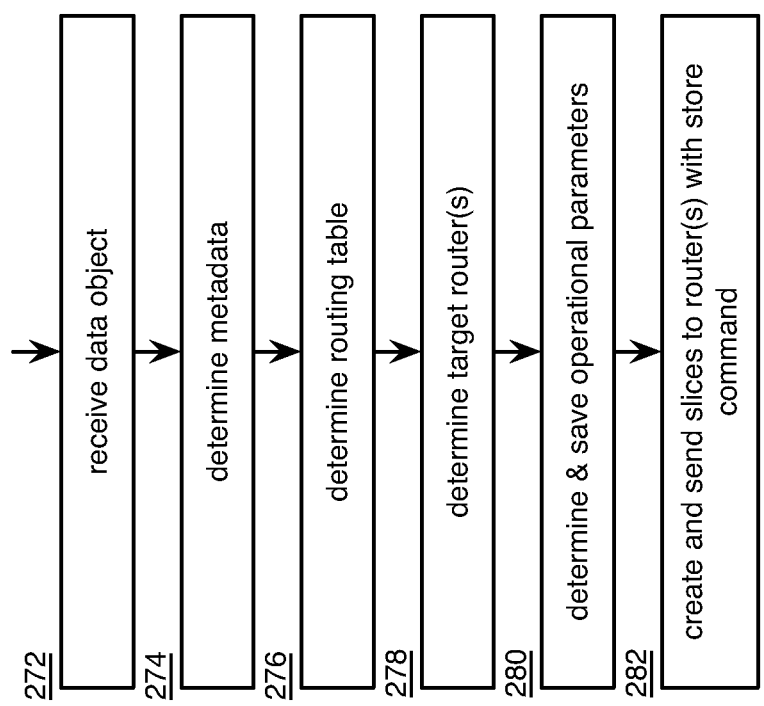
FIG. 19 is a flowchart illustrating the determination of routers in accordance with the invention.

FIG. 19 is a flowchart illustrating the determination of routers where the DS processing unit determines which router to send slices to for storage based in part on the routing table.

The method begins with the step of the DS processing unit receiving a data object to store (e.g., from a user device) 272. The DS processing unit may receive the user ID, the data object name, and metadata associated with the data object.

The DS processing unit determines metadata where the metadata may include one or more of, but is not limited to a hash of the data object, a priority requirement, a security requirement, a performance requirement, a size indicator, a data type indicator, a location requirement, and/or a user ID 274. The determination may be based on one or more of the received metadata, the user ID, the data object name, a data type indicator, the data object, a calculated hash of the data object, a priority indicator, a security indicator, a performance requirement, a command, a user vault lookup, geographic location of the user device, a location requirement, and/or a predetermination.

The DS processing unit determines the routing table where the determination may be based on one or more of querying the routing table, querying the routing engine, and/or performing the discovery method previously described 276.

The DS processing unit determines the target router (or routers for a storage set) based on one or more of, but not limited to the routing table, the metadata, requirements indicated by a router status indicator, a router performance history indicator, a router attributes list (e.g., maximum memory), an available router memory indicator, a maximum number of routes from the DS processing unit to the candidate storage node (router), a minimum number of nodes along the route from the DS processing unit to the candidate storage node, and/or a router affiliation with a DS unit 278. For example, the DS processing may determine to target router 2 since it has enough memory and is just one node away from the DS processing unit. In another example, the DS processing may determine to target router 5 since it has enough memory and is just two nodes away from the DS processing unit when router 2 did not have enough memory. Note that the DS processing unit may or may not save which router was chosen based on the distributed storage method as previously discussed.

The DS processing unit determines the operational parameters (e.g., discussed with reference to FIG. 3) based on one or more of, but not limited to the target router(s), the metadata, a capability indicator of the target router(s), a command, a predetermination, and/or a user vault lookup 280.

The DS processing unit may save the operational parameters in the user vault, in the metadata, and/or another memory 280. The DS processing unit may or may not save the target router choices (e.g., per slice name and/or data segment ID) in the user vault, a virtual DSN address (e.g., slice name) to physical location table, and/or another memory. In one embodiment, the DS processing unit performs subsequent slice retrievals through another method when the DS processing unit does not save the target router choices. In another embodiment, the DS processing unit performs subsequent slice retrievals by looking up in memory where the slices are stored when the DS processing unit saves the target router choices.

The DS processing unit encodes and slices the data object to produce the slices in accordance with the operational parameters 282. The DS processing unit may append the metadata to the slices and sends the slices to the target router(s) with a store command for subsequent storage in the target router(s) in accordance with the operational parameters 282. Note that the DS processing unit may send one slice, all the slices batched for a pillar of a data segment, all the slices of a data segment, all the slices of all the data segments of the data object 282. The method may branch back to the step where the DS processing unit determines the target router(s) when the DS processing unit is not finished creating and sending slices for the data object. For example, the steps described above may repeat for the next data segment.

In an embodiment, the DS processing unit sends at least a write threshold of slices to the top rated routers for storage. The write threshold may be the minimum number of pillars allowed to successfully store to in accordance with the operational parameters. Note that the write threshold is equal to or greater than the read threshold k and less than or equal to the pillar width n. The DS processing unit may send any reaming pillars of slices beyond the write threshold to equal to or less than the pillar width n to routers with a rating that is equal to or less than the rating of the top rated routers for storage.

Figure 20:
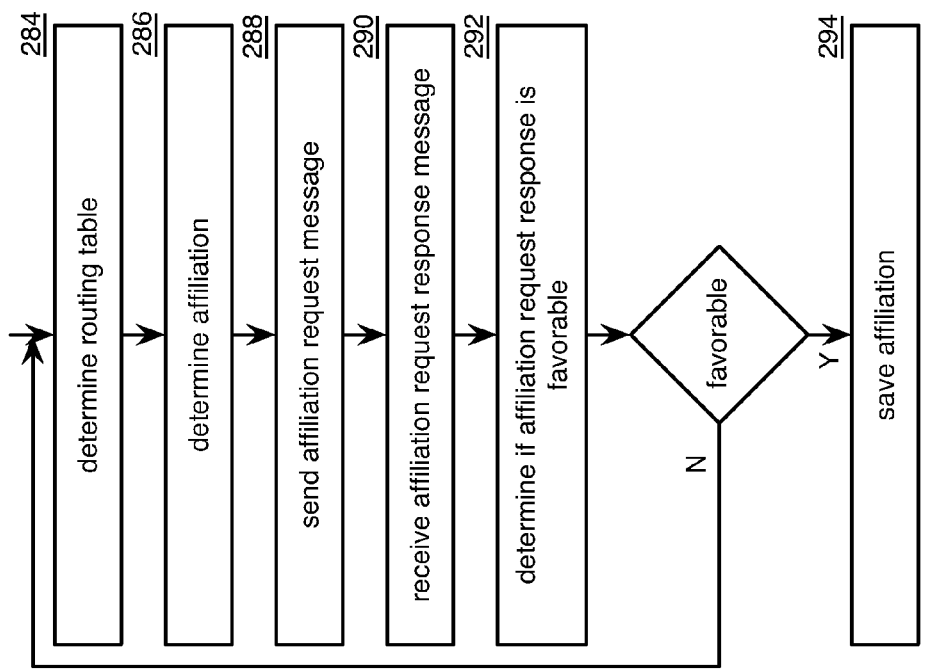
FIG. 20 is a flowchart illustrating the affiliation determination of a router in accordance with the invention.

FIG. 20 is a flowchart illustrating the affiliation determination of a router where the router utilizes the routing table to affiliate with a DS unit.

The method begins with the router DS processing determining the routing table where the determination may be based on one or more of querying the routing table, querying the routing engine, and/or performing the discovery method previously described 284.

The router DS processing determines an affiliation based on one or more of, but not limited to the routing table, a DS unit status indicator, the metadata of a storage sequence, requirements indicated by a router status indicator, a router performance history indicator, a router attributes list (e.g., maximum memory), an available router memory indicator, a maximum number of routes from the router to the candidate DS unit, a minimum number of nodes along the route from the router to the candidate DS unit, and/or a previous or present router affiliation with a DS unit 286. For example, the router 4 DS processing may determine to affiliate with DS unit 1 since the DS unit 1 status indicator indicates it is busy and/or needs help, and is just one node away from the router 4 DS processing.

The router DS processing sends an affiliation request message to the DS unit request that an affiliation be created 288. The router DS processing receives an affiliation request response message that may indicate if the DS unit agrees to the affiliation with a response (e.g., yes or no) 290. The DS unit determines if the DS unit wants the help or not. For example, if the DS unit is temporarily falling behind in DS unit activities, it may agree to the affiliation.

The router DS processing determines if the affiliation request response message is favorable (e.g., favorable=yes and/or agree) 292. The method branches back to the step of the router DS processing determining the routing table when the router DS processing determines that the affiliation request response message is not favorable 284.

The router DS processing saves the affiliation to the DS unit in the routing table, slice memory, and/or DSN memory when the router DS processing determines that the affiliation request response message is favorable 294.

Figure 21:
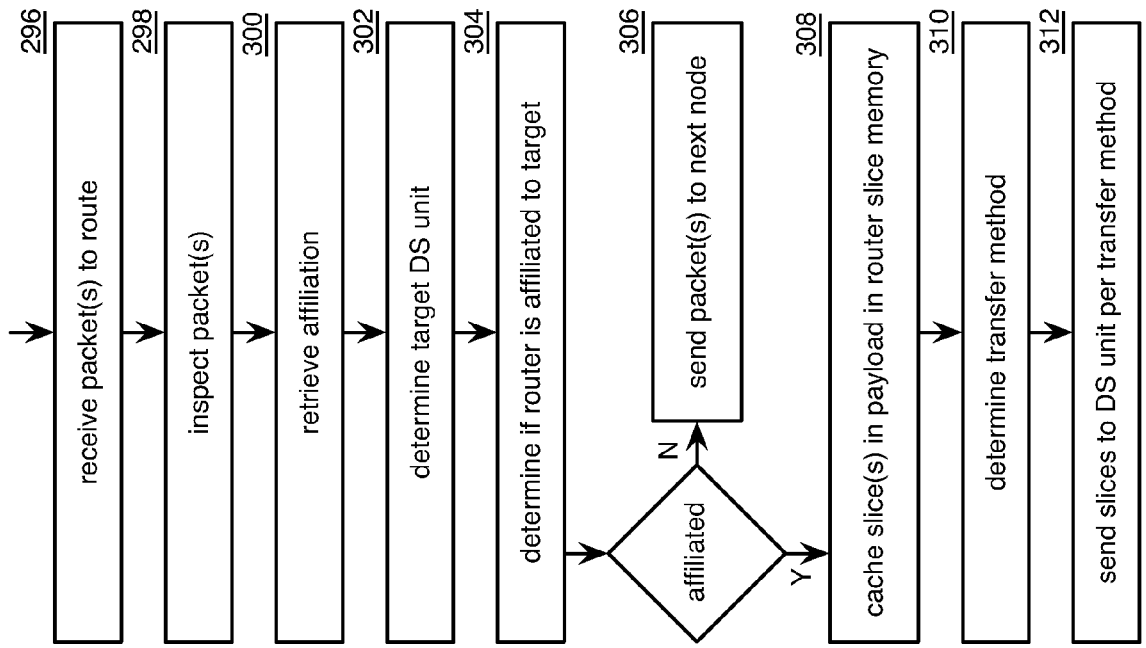
FIG. 21 is a flowchart illustrating the routing of data in accordance with the invention.

FIG. 21 is a flowchart illustrating the routing of data where the router determines how to route traffic and/or store slices based in part on an affiliation to a DS unit.

The method begins with the step where the routing engine receives data packets to route via the router interface 296. The routing engine inspects the packets to produce inspection information (e.g., opens the packets to determine control, payload and routing information such as the destination node, next node) 298. The routing engine retrieves the affiliation from the routing table, slice memory, and/or DSN memory 300.

The routing engine determines the target DS unit based in part on the inspection information (e.g., the destination node) 302. For example, the DS unit ID and/or internet protocol address may be contained in the inspection information.

The routing engine determines if the router is affiliated with the target DS unit based on comparing the retrieved affiliation with the target DS unit 304. Note that a match indicates the router is affiliated with the target DS unit. The routing engine sends the received data packets to the next node (e.g., from the inspection information, a header, a determination by the routing engine based on the destination node and the routing table) when the routing engine determines that the router is not affiliated with the target DS unit 306.

The routing engine caches the slices (e.g., the payload) in the router slice memory when the routing engine determines that the router is affiliated with the target DS unit 308. Note that the router may save the slices for a temporary or long term period.

The routing engine may determine a transfer method to send the cached slices to the DS unit where the method may specify the pace of the transfer (e.g., all at once, all over 24 hours, etc.) 310. The determination may be based on one or more of, but not limited to the routing table, a DS unit status indicator, the metadata of the slices, requirements indicated by a router status indicator, a router performance history indicator, a router attributes list (e.g., maximum memory), an available router memory indicator, a maximum number of routes from the router to the candidate DS unit, a minimum number of nodes along the route from the router to the candidate DS unit, and/or a previous or present router affiliation with a DS unit.

The routing engine sends the slices for storage to the DS unit in accordance with the transfer method 312.

Note that the routing engine may determine if the slices are stored in the cache first upon subsequent retrieval sequences before forwarding the retrieval command to the affiliation DS unit (e.g., when the slices are not cached in the router).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A method for execution by one or more computing devices regarding storage of data, the method comprises:
    obtaining data for storage in a storage as service network environment, wherein the storage as service network environment includes a plurality of storage units that are hosted by one or more storage as service entities;
    determining storage preferences regarding the data based on at least one of the data and a source of the data;

determining a set of the plurality of the storage units from storage units within one or more dispersed storage network (DSN) memories based on the storage preferences;

sending a solicitation request to the set of the plurality of the storage units, wherein the solicitation request includes a representation of the storage preferences;

when at least a minimum number of favorable solicitation responses have been received within a time period, determining a dispersed storage error encoding function based on the favorable solicitation responses, the storage preferences, and available encoding schemes;

encoding the data based on the determined dispersed storage error encoding function to produce a plurality of sets of encoded data slices; and outputting for storage the plurality of sets of encoded data slices to at least some of the storage units providing the favorable solicitation responses.

2. The method of claim 1, wherein the obtaining the data for storage in the storage as service network environment comprises at least one of:

retrieving the data from memory;
receiving the data from the source; and
creating the data.

3. The method of claim 1, wherein the determining the storage preferences of the data based on the data comprises at least one of:

a data type of the data;
a data size of the data;
a data application used to create the data; and
usage of the data.

4. The method of claim 1, wherein the determining the storage preferences of the data based on the source of the data comprises at least one of:

user identifier associated with the data;
geographic location requirements for physical location of storage units in the set of the plurality of the storage units;
user device identifier associated with the data;
a reliability preference; and
a retrieval preference.

5. The method of claim 1, wherein the available encoding schemes comprises:

a first encoding scheme that includes at least one of:
  a first segmenting protocol;
  a first pre-slice data manipulation function;
  a first forward error correction encoding function;
  a first slicing pillar width;
  a first post-slice data manipulation function;
  a first write threshold; and
  a first read threshold; and
a second encoding scheme that includes at least one of:
  a second segmenting protocol;
  a second pre-slice data manipulation function;
  a second forward error correction encoding function;
  a second slicing pillar width;
  a second post-slice data manipulation function;
  a second write threshold; and
  a second read threshold.

6. The method of claim 1, wherein the determining the dispersed storage error encoding function further comprises:

determining to locally store one or more encoded data slices of the plurality of sets of encoded data slices.

7. The method of claim 6, wherein the determining the dispersed storage error encoding function further comprises:

receiving "y" number of favorable solicitation responses;

determining to locally store "f" number of encoded data slices per set of the plurality of sets of encoded data slices; and determining one of the available encoding schemes based on a slicing pillar width number being less than or equal to the "y" number plus the "f" number and based on a decode threshold number being of a desired error coding redundancy level.

8. The method of claim 1, wherein the determining the dispersed storage error encoding function further comprises:

receiving "y" number of favorable solicitation responses; and determining one of the available encoding schemes based on a slicing pillar width number being less than or equal to the "y" number and based on a decode threshold number being of a desired error coding redundancy level.

9. The method of claim 1, wherein the outputting for storage the plurality of sets of encoded data slices to at least some of the storage units providing the favorable solicitation responses further comprises:

storing a file path for the data, wherein the file path includes memory addresses of the storage units and a file name of the data.

10. A computing device comprises:

an interface;
a memory; and
a processing module operably coupled to the interface and the memory, wherein the processing module is operable to:

obtain, via the interface, data for storage in a storage as service network environment, wherein the storage as service network environment includes a plurality of storage units that are hosted by one or more storage as service entities;

determine storage preferences regarding the data based on at least one of the data and a source of the data;

determine a set of the plurality of the storage units from storage units within one or more dispersed storage network (DSN) memories based on the storage preferences;

send, via the interface, a solicitation request to the set of the plurality of the storage units, wherein the solicitation request includes a representation of the storage preferences;

when at least a minimum number of favorable solicitation responses have been received within a time period, determine a dispersed storage error encoding function based on the favorable solicitation responses, the storage preferences, and available encoding schemes;

encode the data based on the determined dispersed storage error encoding function to produce a plurality of sets of encoded data slices; and output for storage, via the interface, the plurality of sets of encoded data slices to at least some of the storage units providing the favorable solicitation responses.

11. The computing device of claim 10, wherein the processing module further functions to obtain the data for storage in the storage as service network environment by at least one of:

retrieving the data from memory;
receiving the data from the source; and
creating the data.

12. The computing device of claim 10, wherein the processing module further functions to determine the storage preferences of the data based on the data by at least one of:

a data type of the data;
a data size of the data;
a data application used to create the data; and
usage of the data.

13. The computing device of claim 10, wherein the processing module further functions to determine the storage preferences of the data based on the source of the data by at least one of:
    user identifier associated with the data;
    geographic location requirements for physical location of storage units in the set of the plurality of the storage units;
    user device identifier associated with the data;
    a reliability preference; and
    a retrieval preference.

14. The computing device of claim 10, wherein the available encoding schemes comprises:
    a first encoding scheme that includes at least one of:
        a segmenting protocol;
        a pre-slice data manipulation function;
        a forward error correction encoding function;
        a slicing pillar width;
        a post-slice data manipulation function;
        a write threshold; and
        a read threshold; and
    a second encoding scheme that includes at least one of:
        a second segmenting protocol;
        a second pre-slice data manipulation function;
        a second forward error correction encoding function;
        a second slicing pillar width;
        a second post-slice data manipulation function;
        a second write threshold; and
        a second read threshold.

15. The computing device of claim 10, wherein the processing module further functions to determine the dispersed storage error encoding function by:
    determining to locally store one or more encoded data slices of the plurality of sets of encoded data slices.

16. The computing device of claim 15, wherein the processing module further functions to determine the dispersed storage error encoding function by:
    receiving "y" number of favorable solicitation responses;
    determining to locally store "f" number of encoded data slices per set of the plurality of sets of encoded data slices; and
    determining one of the available encoding schemes based on a slicing pillar width number being less than or equal to the "y" number plus the "f" number and based on a decode threshold number being of a desired error coding redundancy level.

17. The computing device of claim 10, wherein the processing module further functions to determine the dispersed storage error encoding function by:
    receiving "y" number of favorable solicitation responses; and
    determining one of the available encoding schemes based on a slicing pillar width number being less than or equal to the "y" number and based on a decode threshold number being of a desired error coding redundancy level.

18. The computing device of claim 10, wherein the processing module further functions to output for storage, via the interface, the plurality of sets of encoded data slices to at least some of the storage units providing the favorable solicitation responses by:
storing a file path for the data, wherein the file path includes memory addresses of the storage units and a file name of the data.

19. A computer readable storage memory comprises:
    a first storage section that stores operational instructions that, when executed by one or more processing modules, causes the one or more processing modules to:
        obtain data for storage in a storage as service network environment, wherein the storage as service network environment includes a plurality of storage units that are hosted by one or more storage as service entities;
    a second storage section that stores operational instructions that, when executed by the one or more processing modules, causes the one or more processing modules to:
        determine storage preferences regarding the data based on at least one of the data and a source of the data;
    a third storage section that stores operational instructions that, when executed by the one or more processing modules, causes the one or more processing modules to:
        determine a set of the plurality of storage units from storage units within one or more dispersed storage network (DSN) memories based on the storage preferences;
        send a solicitation request to the set of the plurality of storage units, wherein the solicitation request includes a representation of the storage preferences;
        when at least a minimum number of favorable solicitation responses have been received within a time period, determine a dispersed storage error encoding function based on the favorable solicitation responses, the storage preferences, and available encoding schemes;
        encode the data based on the determined dispersed storage error encoding function to produce a plurality of sets of encoded data slices; and
        output for storage the plurality of sets of encoded data slices to at least some of the storage units providing the favorable solicitation responses.

20. The computer readable storage memory of claim 19, wherein the first storage section further stores operational instructions that, when executed by the one or more processing modules, causes the one or more processing modules to obtain the data for storage in the storage as service network environment by at least one of:
    retrieving the data from memory;
    receiving the data from the source; and
    creating the data.

21. The computer readable storage memory of claim 19, wherein the second storage section further stores operational instructions that, when executed by the one or more processing modules, causes the one or more processing modules to determine the storage preferences of the data based on the data by at least one of:
    a data type of the data;
    a data size of the data;
    a data application used to create the data; and
    usage of the data.

22. The computer readable storage memory of claim 19, wherein the second storage section further stores operational instructions that, when executed by the one or more processing modules, causes the one or more processing modules to determine the storage preferences of the data based on the source of the data by at least one of:
    user identifier associated with the data;
    geographic location requirements for physical location of storage units in the set of the plurality of the storage units;

user device identifier associated with the data;
a reliability preference; and
a retrieval preference.

23. The computer readable storage memory of claim 19, wherein the available encoding schemes comprises:
a first encoding scheme that includes at least one of:
  a first segmenting protocol;
  a first pre-slice data manipulation function;
  a first forward error correction encoding function;
  a first slicing pillar width;
  a first post-slice data manipulation function;
  a first write threshold; and
  a first read threshold; and
a second encoding scheme that includes at least one of:
  a second segmenting protocol;
  a second pre-slice data manipulation function;
  a second forward error correction encoding function;
  a second slicing pillar width;
  a second post-slice data manipulation function;
  a second write threshold; and
  a second read threshold.

24. The computer readable storage memory of claim 19, wherein the third storage section further stores operational instructions that, when executed by the one or more processing modules, causes the one or more processing modules to determine the dispersed storage error encoding function by:
determining to locally store one or more encoded data slices of the plurality of sets of encoded data slices.

25. The computer readable storage memory of claim 24, wherein the third storage section further stores operational instructions that, when executed by the one or more processing modules, causes the one or more processing modules to determine the dispersed storage error encoding function by:
receiving "y" number of favorable solicitation responses;
determining to locally store "f" number of encoded data slices per set of the plurality of sets of encoded data slices; and
determining one of the available encoding schemes based on a slicing pillar width number being less than or equal to the "y" number plus the "f" number and based on a decode threshold number being of a desired error coding redundancy level.

26. The computer readable storage memory of claim 19, wherein the third storage section further stores operational instructions that, when executed by the one or more processing modules, causes the one or more processing modules to determine the dispersed storage error encoding function by:
receiving "y" number of favorable solicitation responses; and
determining one of the available encoding schemes based on a slicing pillar width number being less than or equal to the "y" number and based on a decode threshold number being of a desired error coding redundancy level.

27. The computer readable storage memory of claim 19, wherein the third storage section further stores operational instructions that, when executed by the one or more processing modules, causes the one or more processing modules to output for storage the plurality of sets of encoded data slices to at least some of the storage units providing the favorable solicitation responses by:
storing a file path for the data, wherein the file path includes memory addresses of the storage units a file name of the data.

* * * * *